United States Patent
Kawamura

(10) Patent No.: US 8,926,174 B2
(45) Date of Patent: Jan. 6, 2015

(54) CONTROLLER OF POWER CONVERTER

(75) Inventor: Hiromichi Kawamura, Yamato (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 207 days.

(21) Appl. No.: 13/701,317

(22) PCT Filed: Jun. 3, 2011

(86) PCT No.: PCT/JP2011/062815
§ 371 (c)(1),
(2), (4) Date: Nov. 30, 2012

(87) PCT Pub. No.: WO2011/152526
PCT Pub. Date: Dec. 8, 2011

(65) Prior Publication Data
US 2013/0135906 A1    May 30, 2013

(30) Foreign Application Priority Data

Jun. 3, 2010 (JP) ................................. 2010-127386
Sep. 10, 2010 (JP) ................................. 2010-203095

(51) Int. Cl.
*G01K 7/00* (2006.01)
*H02M 1/14* (2006.01)
*H01L 23/36* (2006.01)
*H01L 23/473* (2006.01)
*H02P 27/08* (2006.01)
*H02P 29/00* (2006.01)
*H02M 1/32* (2007.01)

(52) U.S. Cl.
CPC ................. *H02M 1/14* (2013.01); *H01L 23/36* (2013.01); *H01L 23/473* (2013.01); *H02P 27/085* (2013.01); *H02P 29/0088* (2013.01); *H02M 1/32* (2013.01); *H01L 2224/73265* (2013.01)
USPC ............................ 374/163; 374/178; 713/322

(58) Field of Classification Search
USPC ................. 713/300, 320, 322, 323, 501, 601; 361/115, 97, 63, 94, 106; 374/178, 374/181, 163, 170, 173
See application file for complete search history.

(56) References Cited

U.S. PATENT DOCUMENTS 5,064,296 A * 11/1991 Huijsing et al. ............... 374/163
5,085,526 A * 2/1992 Sawtell et al. ................ 374/101
(Continued)

FOREIGN PATENT DOCUMENTS

CN     101610039 A    12/2009
JP     9-233832 A      9/1997
(Continued)

*Primary Examiner* — Rajnikant Patel
(74) *Attorney, Agent, or Firm* — Foley & Lardner LLP

(57) ABSTRACT

A controller of a power converter has: an average loss calculator (202) calculating an average loss in a semiconductor device; and a partial temperature variation estimation part (204), while regarding the semiconductor device as a thermal network including at least one combination of a thermal resistance and a thermal time constant, estimating a partial temperature variation of the combination from a loss in the semiconductor device and the combination of the thermal resistance and the thermal time constant. The partial temperature variation estimation part (204) estimates an average temperature from the loss, the thermal resistance, and the thermal time constant; extracts a pulsation envelope temperature exceeding the maximum value of a pulsation temperature dependent on the average loss and the pulsation frequency; and estimates a temperature variation in the semiconductor device by adding the average temperature and the pulsation envelope temperature.

15 Claims, 26 Drawing Sheets

(56) References Cited

U.S. PATENT DOCUMENTS

| | | |
|---|---|---|
| 5,875,414 A | 2/1999 | Tsutsumi |
| 6,112,164 A * | 8/2000 | Hobson .................... 702/132 |
| 6,442,700 B1 * | 8/2002 | Cooper .................... 713/320 |
| 6,487,668 B2 * | 11/2002 | Thomas et al. ............ 713/322 |
| 7,071,649 B2 | 7/2006 | Shafer et al. |
| 7,756,669 B2 | 7/2010 | Stancu et al. |
| 2003/0071594 A1 | 4/2003 | Kleinau et al. |
| 2003/0076061 A1 | 4/2003 | Kleinau et al. |
| 2003/0076064 A1 | 4/2003 | Kleinau et al. |
| 2007/0132446 A1 | 6/2007 | Kleinau et al. |
| 2009/0319115 A1 | 12/2009 | Stancu et al. |

FOREIGN PATENT DOCUMENTS

| | | |
|---|---|---|
| JP | 2000-228882 A | 8/2000 |
| JP | 2003-18861 A | 1/2003 |
| JP | 2003-134869 A | 5/2003 |

* cited by examiner

FIG. 3
(a)
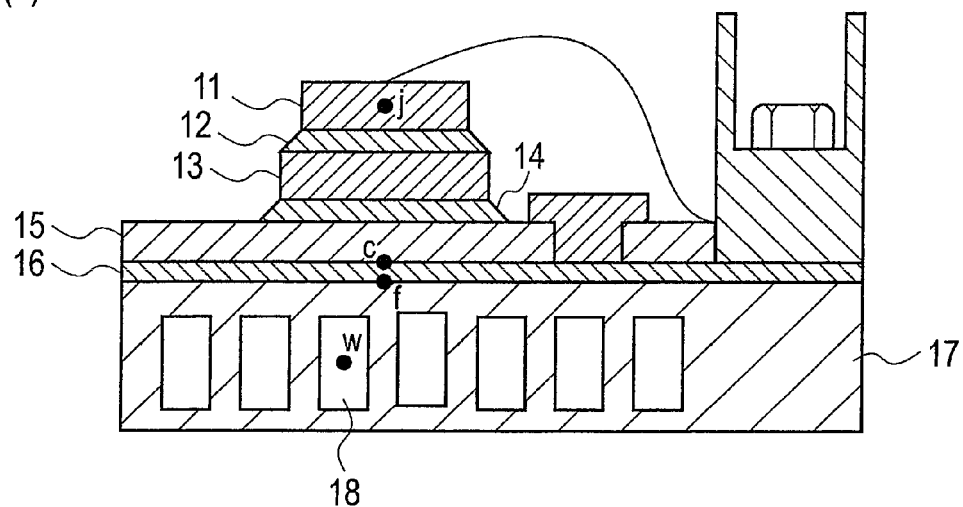
(b)
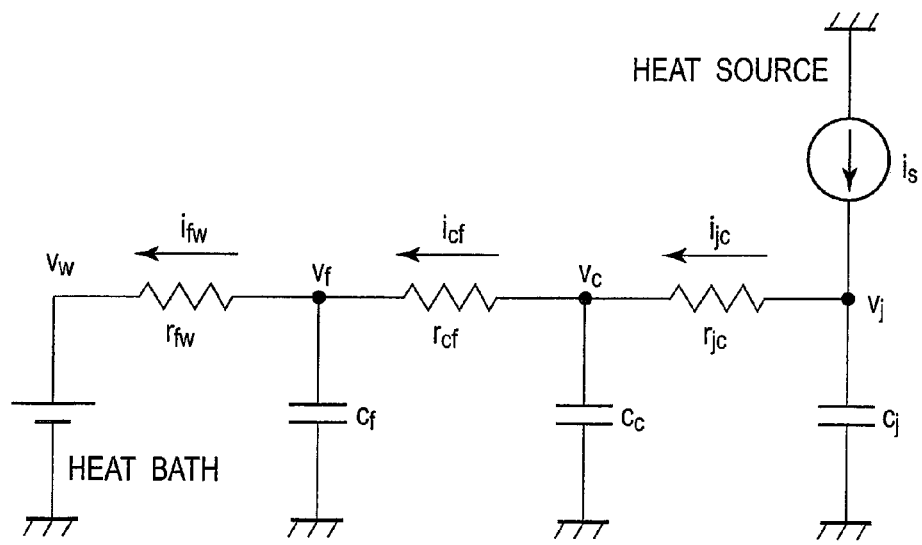

FIG. 4
(a)
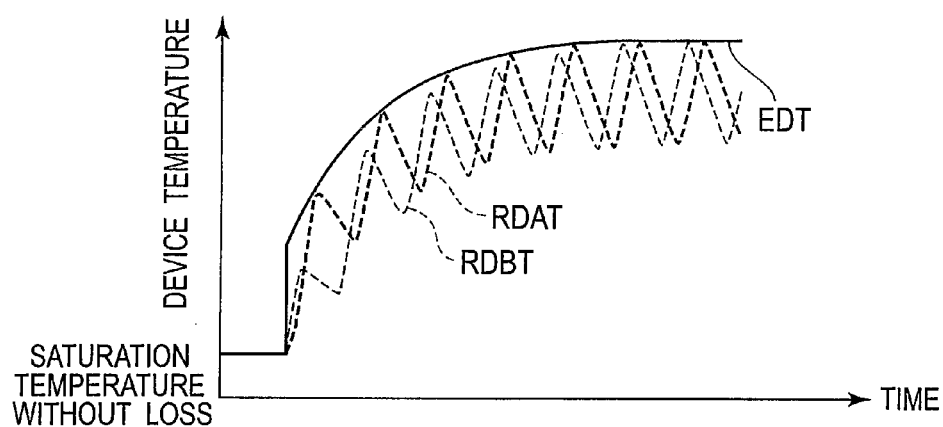
(b)
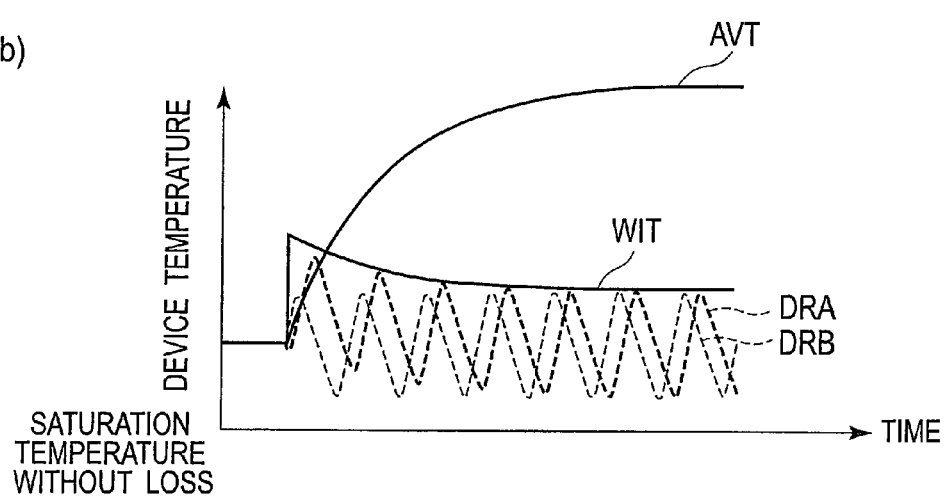

FIG. 7
(a)
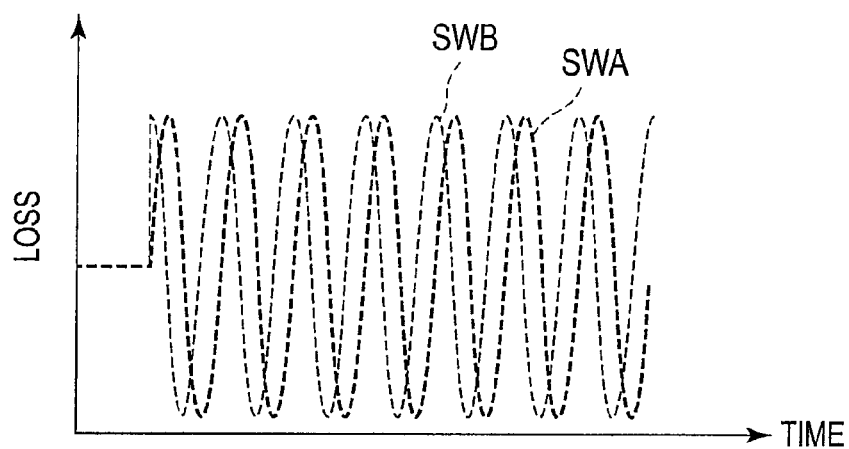
(b)
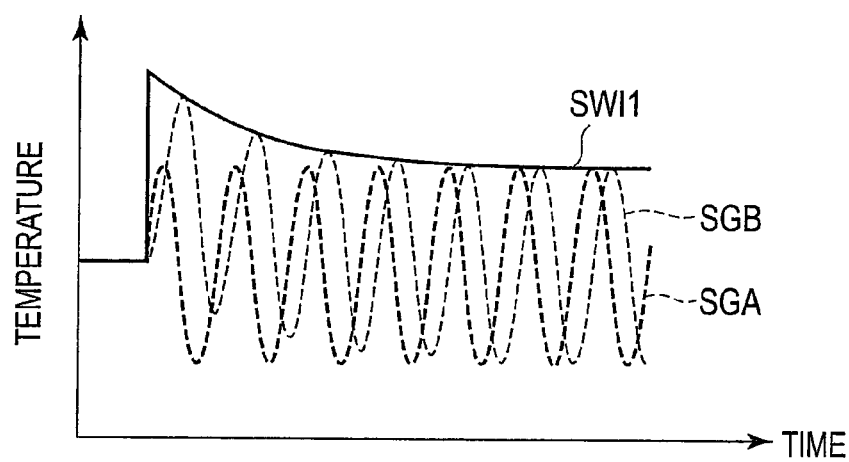

FIG. 9
(a)
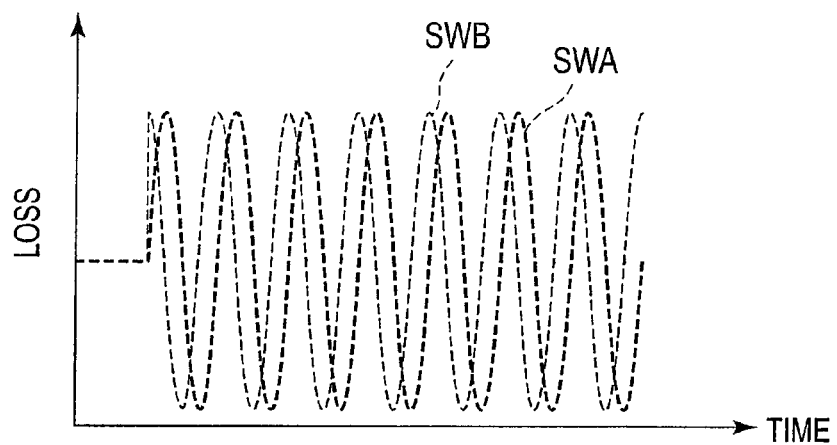
(b)
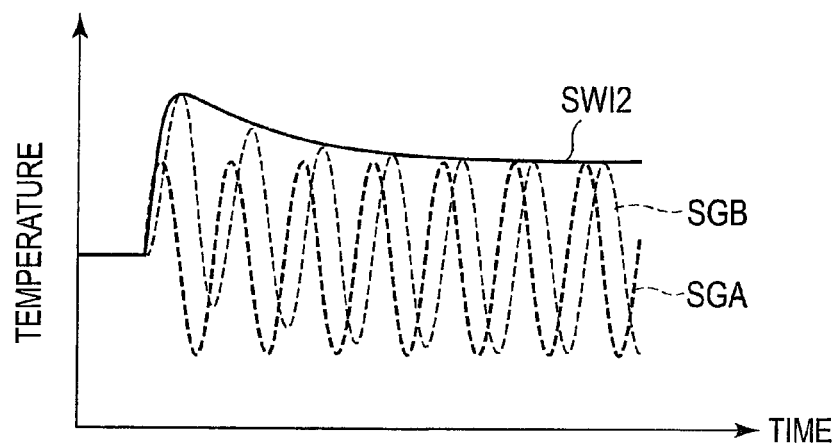

FIG. 12
(a)
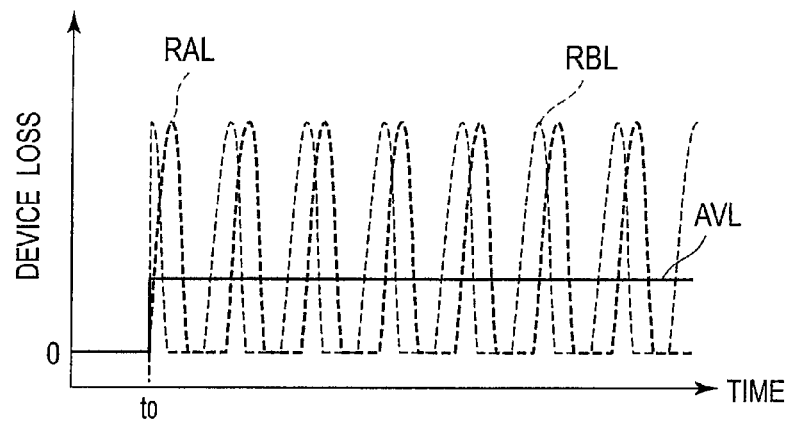
(b)
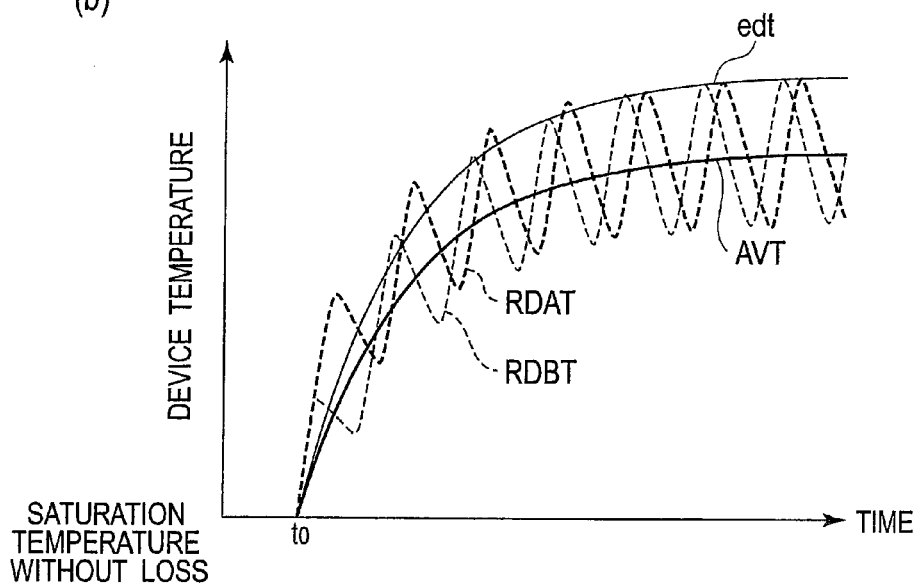

FIG. 20
(a)
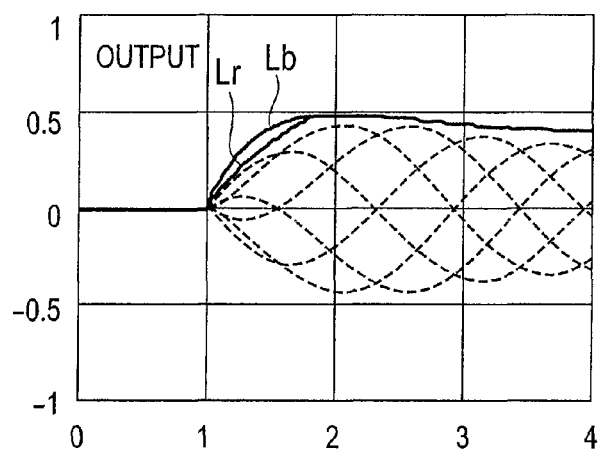
(b)
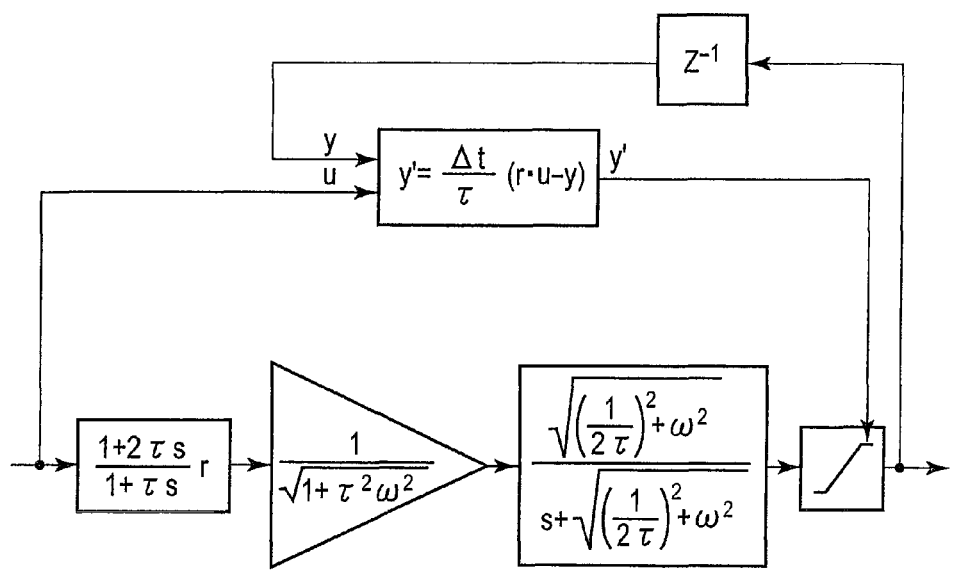

FIG. 24
(a)
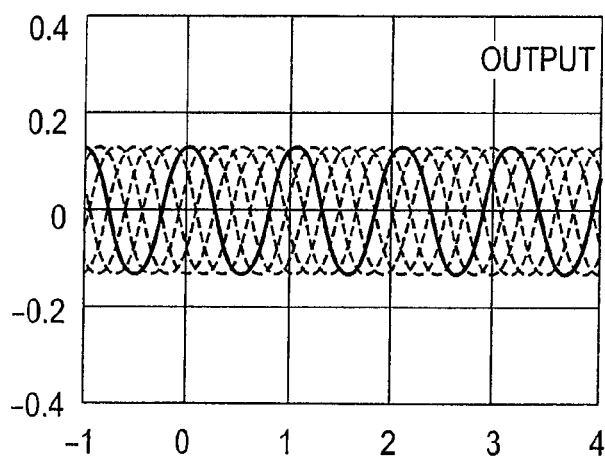
(b)
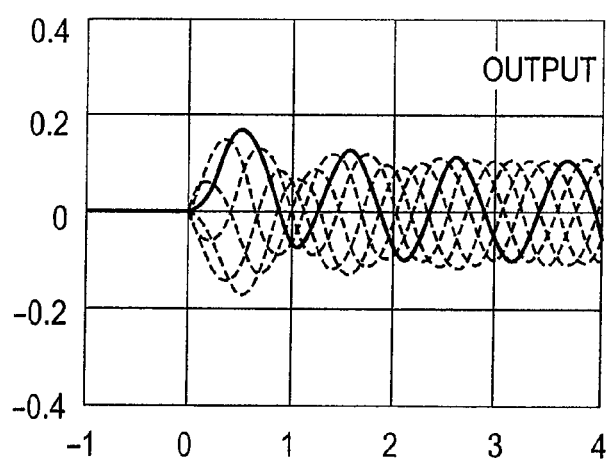
(c)
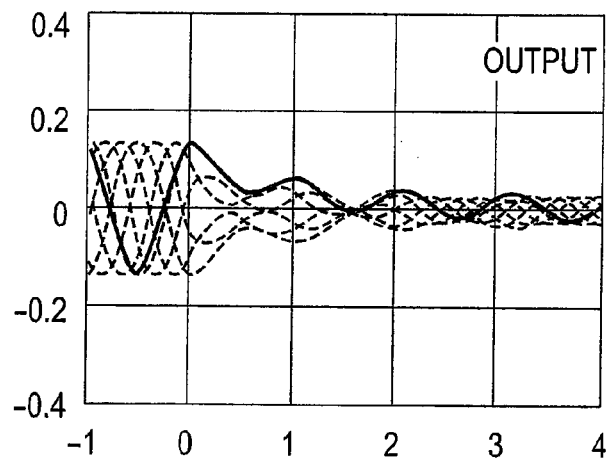

FIG. 25
(a)
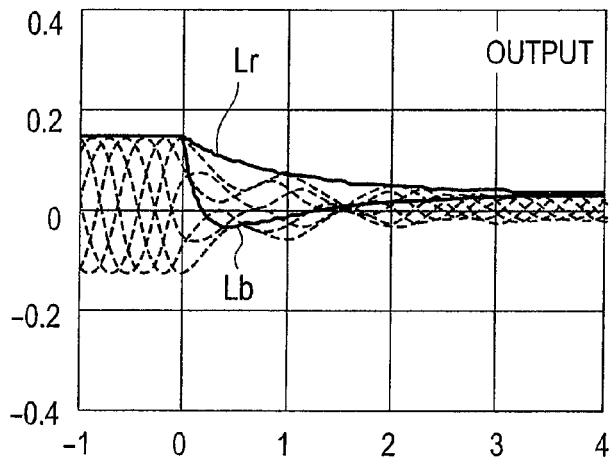
(b)
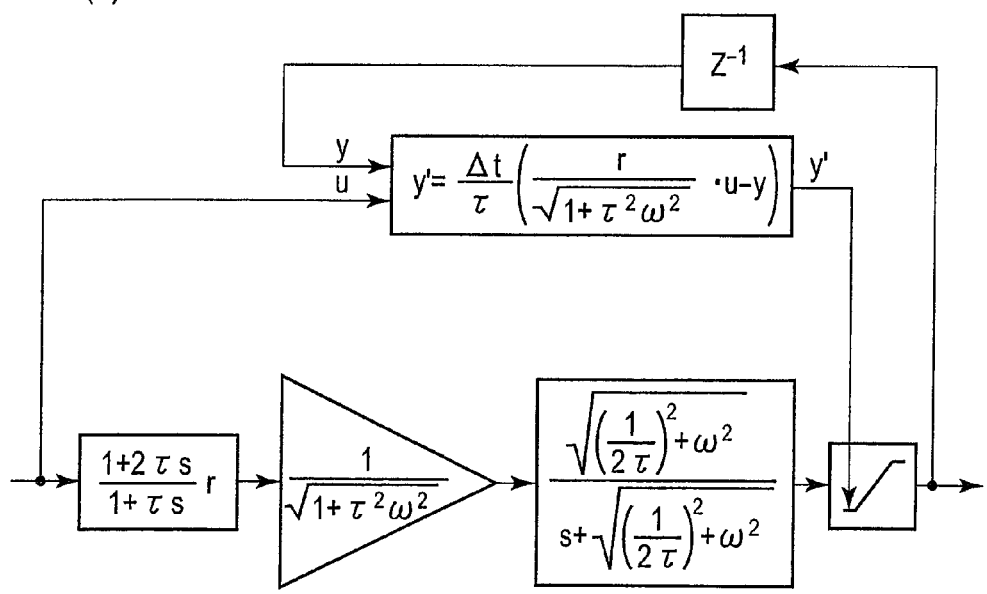

CONTROLLER OF POWER CONVERTER

TECHNICAL FIELD

The present invention relates to a controller of a power converter.

BACKGROUND ART

Heretofore, there has been known a technique for protecting a semiconductor switching device (abbreviated as "device" below) in an inverter from thermal destruction (see Patent Literature 1).

In Patent Literature 1, an average temperature of a device is estimated from an average loss in a period of an output current. In a region where the motor revolution speed is high and the device temperature hardly pulsates during a period of the output current, the average temperature is used as an estimated temperature. On the other hand, in a region where the motor revolution speed is low and the device temperature largely pulsates during a period of the output current, the average temperature is multiplied by a coefficient based on the revolution speed, and a peak value of the pulsating temperature is used as an estimated temperature.

CITATION LIST

Patent Literature

[Patent Literature 1] Japanese Patent Application Publication No. 2000-228882

SUMMARY OF INVENTION

In the technique disclosed in Patent Literature 1, in the region where the motor revolution speed is low, the device can be protected in a saturated state in which the average temperature is saturated with a certain amount of loss occurring for a time period sufficiently longer than a time constant of temperature variation in the device. However in a transit state in which the average temperature of the device is not saturated with the amount of loss varying during a time period shorter than the time constant of temperature variation in the device, the maximum value of the pulsating temperature exceeds the estimated temperature, and the device cannot be protected.

The present invention has been made in view of such a conventional problem, and aims to provide a controller of a power converter, capable of effectively protecting a device from thermal destruction not only in the average-temperature saturated state but also in the average-temperature transit state, by estimating a temperature exceeding the maximum value of the pulsating temperature.

A controller of a power converter according to a feature of the present invention includes: an average loss calculator configured to calculate an average loss in a semiconductor device in a period of carrying out an estimation calculation of a temperature of the semiconductor device; and a partial temperature variation estimation part configured to, while regarding the semiconductor device as a thermal network including at least one combination of a thermal resistance and a thermal time constant, estimate a partial temperature variation of the combination from a loss in the semiconductor device and the combination of the thermal resistance and the thermal time constant. The partial temperature variation estimation part estimates an average temperature from the loss, the thermal resistance, and the thermal time constant, extracts, by use of the thermal resistance, the thermal time constant, and a pulsation frequency of the loss, a pulsation envelope temperature exceeding the maximum value of a pulsation temperature dependent on the average loss and the pulsation frequency, and estimates a temperature variation in the semiconductor device by adding the average temperature and the pulsation envelope temperature.

According to the controller of the power converter related to the present invention, the semiconductor device can be effectively protected from heat by estimating a temperature exceeding the maximum value of the pulsating temperature, not only in the average-temperature saturated state but also in the average-temperature transit state.

BRIEF DESCRIPTION OF DRAWINGS

FIG. 3(a) is a sectional view showing a concrete configuration example of each semiconductor device included in a semiconductor module 104; and FIG. 3(b) is a circuit diagram showing an example of a three-dimensional thermal network model of the semiconductor device of FIG. 3(a).

FIG. 4 shows waveform examples of components calculated in the calculation processing in FIG. 2; FIG. 4(a) shows actual instantaneous temperatures RDAT and RDBT of two semiconductor devices A and B having different phases, and estimated device temperature EDT; and FIG. 4(b) shows an average temperature AVT, respective differences DRA and DRB between the instantaneous temperatures RDAT and RDBT and the average temperature AVT, and a pulsation envelope temperature WIT.

FIG. 7(a) is a graph showing single-frequency pulsation losses SWA and SWB in semiconductor devices A and B; and FIG. 7(b) is a graph showing single-frequency pulsation temperatures SGA and SGB in the semiconductor devices A and B, and a single-frequency pulsation envelope temperature SWI1.

FIG. 9(a) is a graph showing single-frequency pulsation losses SWA and SWB in semiconductor devices A and B; and FIG. 9(b) is a graph showing single-frequency pulsation temperatures SGA and SGB in the semiconductor devices A and B, and a single-frequency pulsation envelope temperature SWI2.

FIG. 12 are graphs showing examples of estimated device temperatures of a first comparative example; FIG. 12(a) shows temporal variations RAL and RBL in losses occurring in the semiconductor devices A and B, and average values AVL; and FIG. 12(b) shows an estimated device temperature edt, an average temperature AVT, and instantaneous temperatures RDAT and RDBT of the semiconductor devices A and B.

FIG. 20(a) is a graph exemplifying output waveforms; and FIG. 20(b) is a block configuration diagram schematically showing an explanation on the upper limiter.

FIG. 24(a) is a graph showing output waveforms of a maximum phase corresponding to the input amplitude u1; FIG. 24(b) is a graph showing output waveforms of a maximum phase corresponding to the input amplitude u2; and FIG. 24(c) is a graph showing output waveforms of a combined maximum phase.

FIG. 25(a) is a graph exemplifying output waveforms; and FIG. 25(b) is a block configuration diagram schematically showing an explanation on the lower limiter.

DESCRIPTION OF EMBODIMENTS

Figure 1:
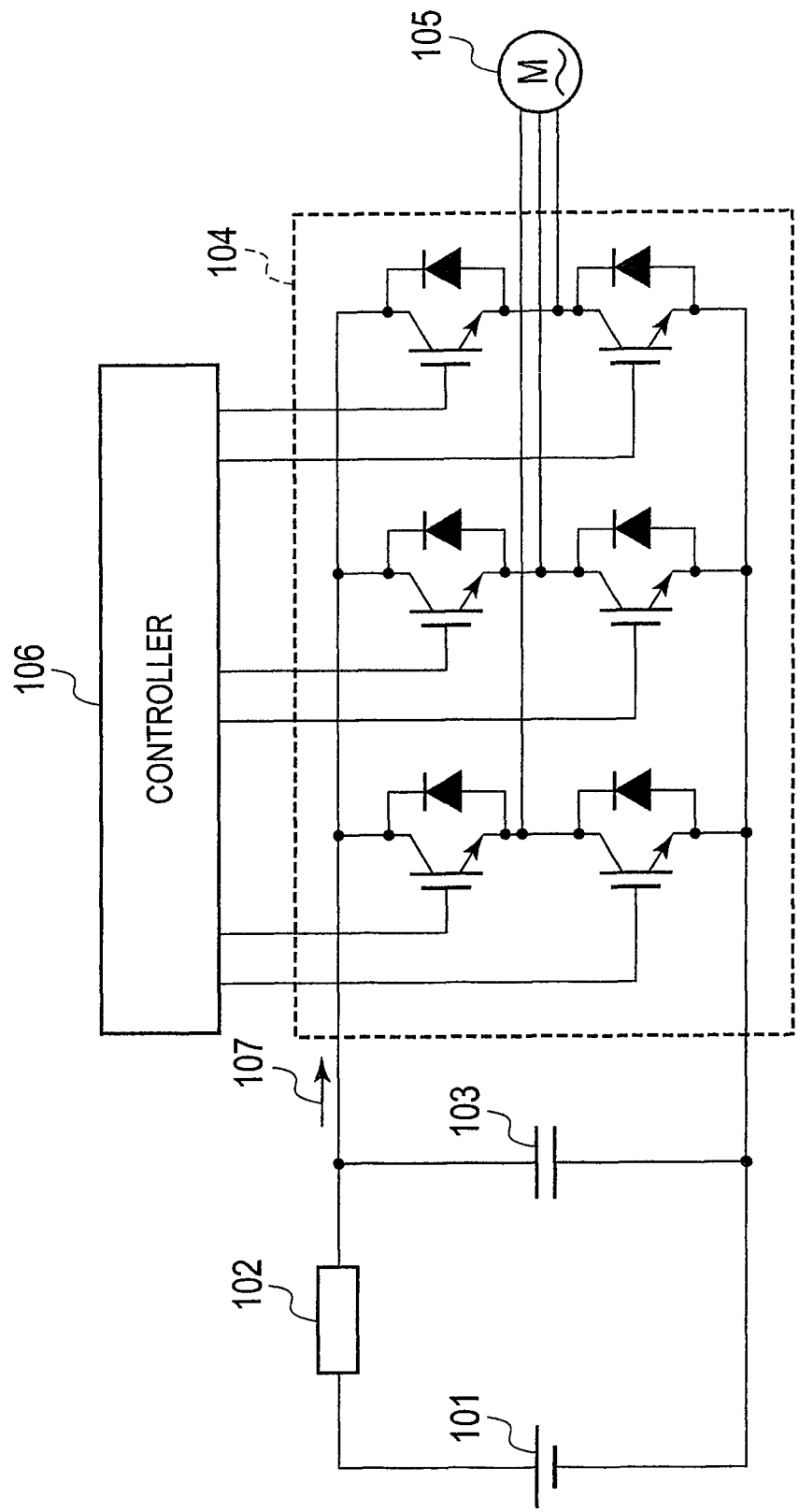
FIG. 1 is a schematic view showing an overall configuration of a power conversion system including a power converter and its controller of a first embodiment of the present invention.

Hereinafter, embodiments of the present invention will be described with reference to the drawings. In the descriptions of the drawings, the same portions are assigned the same reference numerals, and descriptions thereof are omitted.

First Embodiment

Referring to FIG. 1, a description will be given of an overall configuration of a power conversion system including a power converter and its controller of a first embodiment of the present invention. The power conversion system includes, for example, a semiconductor module 104 included in an inverter which converts a DC power of a battery 101 into an AC power for driving a three-phase induction motor such as a three-phase AC motor 105, for example, and a controller 106 for controlling the amount of the power.

The semiconductor module 104 is included in an inverter (three-phase output inverter) using six semiconductor switching devices (abbreviated as "semiconductor device" below). Specifically, three combinations of two semiconductor devices connected in series are connected in parallel between both terminals of the battery 101. Each of the electric potentials between each combination of the semiconductor devices connected in series is applied to a corresponding one of three input terminals of the three-phase AC motor 105. A control electrode of each semiconductor device is connected to the controller 106, and the controller 106 performs variable control of voltage and frequency by PWM for each semiconductor device.

For example, the controller 106 calculates a torque that should be generated by a drive motor in response to an acceleration or deceleration request from a driver, in order for the vehicle to operate according to the driver's intention. Then, the controller 106 controls the amount of power to be supplied from the battery 101 to the three-phase AC motor 105 being the drive motor, by controlling switching among the semiconductor devices included in the semiconductor module 104 on the basis of the calculated magnitude of torque.

In addition, the switching frequency of the semiconductor module 104 is generally set to about 1 kHz to 1000 kHz, which is approximately five times higher than the phase current frequency of the three-phase AC motor 105 or more. Moreover, an input current 107 of the semiconductor module contains a large amount of ripple of a frequency close to the switching frequency. For this reason, if the input current 107 is to be generated only by a battery such as the battery 101, an impedance 102 on the battery 101 side including the power cable becomes so large that a voltage pulsation exceeds the withstand voltage of components of the power conversion system. Hence, to suppress the voltage pulsation, a smoothing capacitor 103 with a lower impedance than the battery 101 is connected in parallel, immediately near the semiconductor module 104.

Each semiconductor device included in the semiconductor module 104 generates a loss according to the amount of the current flowing therethrough during operation. Then, the semiconductor device is heated with the loss, and its temperature rises. It is known that an excessive rise in the temperature of the semiconductor device leads to a failure in the semiconductor device. For this reason, the controller 106 in FIG. 1 performs control to suppress an excessive temperature rise in the semiconductor device.

If a temperature measuring element is attached near the semiconductor device for suppression of an excessive temperature rise in the semiconductor device, for example, insulation processing needs to be performed between the temperature measuring element and the controller, which complicates the circuit configuration. Hence, the controller 106 of the first embodiment estimates the temperature of the semiconductor device according to operation conditions of the power converter and the three-phase AC motor 105, and controls the current amount of the semiconductor device on the basis of the estimated temperature of the semiconductor device.

Figure 2:
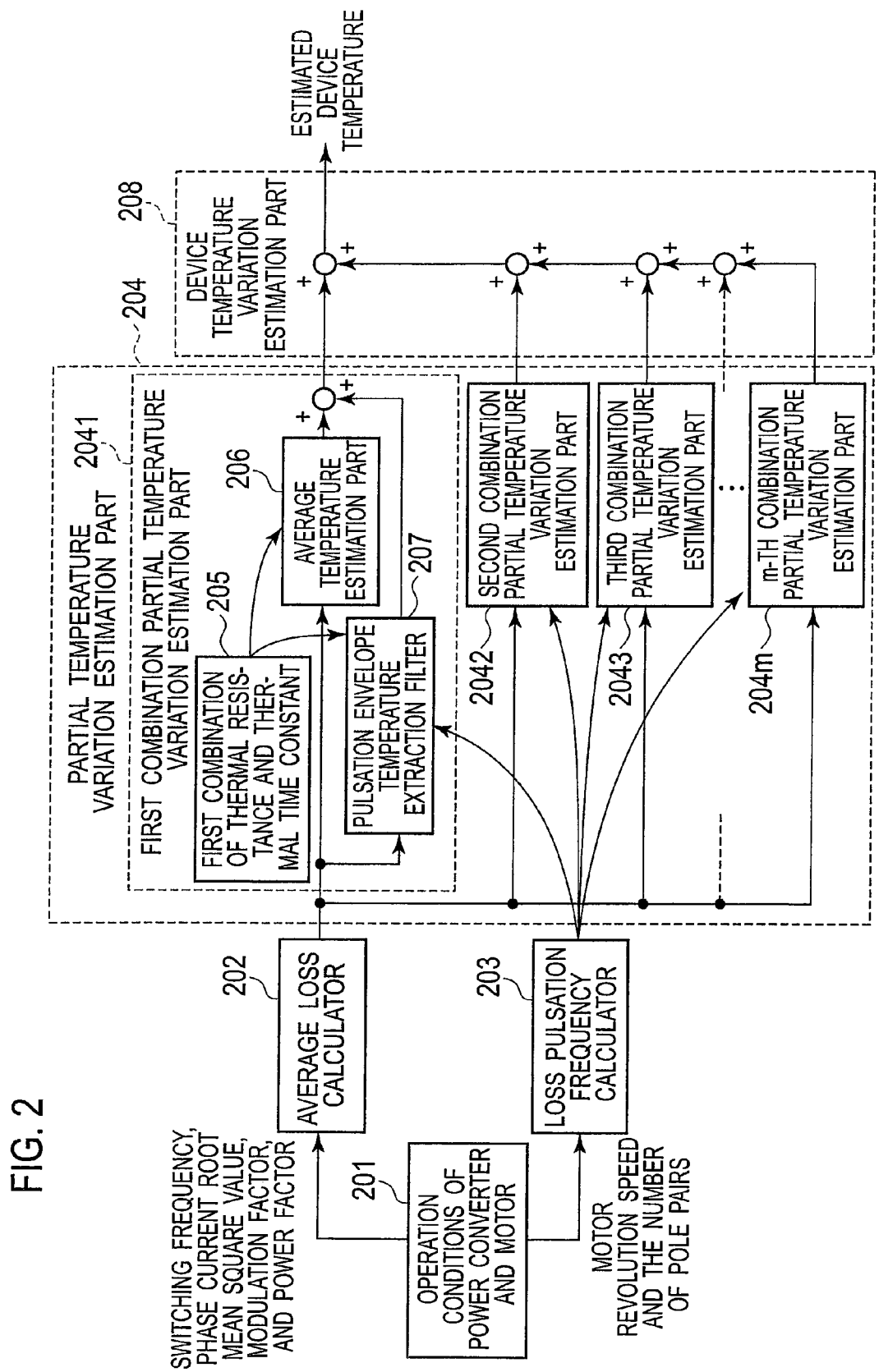
FIG. 2 is a block diagram showing an outline of calculation processing for estimating the temperature of a semiconductor device, according to operational conditions of the power converter and a three-phase AC motor 105 in the controller of FIG. 1.

Referring to FIG. 2, a description will be given of an outline of the calculation processing carried out by the controller 106, for estimating the temperature of the semiconductor device according to the operation conditions of the power converter and the three-phase AC motor 105. The controller 106 includes calculation functions serving as an average loss calculator 202, a loss pulsation frequency calculator 203, a partial temperature variation estimation part 204, and a device temperature variation estimation part 208, which will be described below.

The average loss calculator 202 calculates an average loss of the semiconductor device, in a period for carrying out an estimation calculation of the temperature of the semiconductor device according to operation conditions 201 of the three-phase AC motor 105 and the power converter. Examples of the operation conditions mainly contributing to the average loss of the semiconductor device include a switching frequency, a phase current root mean square value, a modulation factor, and a power factor.

The loss pulsation frequency calculator 203 calculates a pulsation frequency of loss in the semiconductor device according to operation conditions 201 of the three-phase AC motor 105 and the power converter. Examples of the operation conditions mainly contributing to the pulsation frequency of loss in the semiconductor device include a motor revolution speed and the number of pole pairs.

The partial temperature variation estimation part 204 regards the semiconductor device as a thermal network including two or more combinations (m combinations in FIG. 2) of a thermal resistance and a thermal time constant, and estimates the partial temperature variation for each combination by use of the loss and the combination of thermal resistance and thermal time constant of the semiconductor device. To be specific, the partial temperature variation estimation part 204 calculates the partial temperature for each combination of a thermal resistance and a thermal time constant on the basis of the average loss and the pulsation frequency of loss in the semiconductor device.

In accordance with the number (m) of combinations of thermal resistance and thermal time constant included in the aforementioned thermal network, the partial temperature variation estimation part 204 includes a first combination partial temperature variation estimation part 2041, a second combination partial temperature variation estimation part 2042, a third combination partial temperature variation estimation part 2043, . . . , and an m-th combination partial temperature variation estimation part 204m.

Each of the first to m-th combination partial temperature variation estimation parts 2041 to 204m includes: an average temperature estimation part 206 for estimating an average temperature from the loss, thermal resistance, and thermal time constant of the semiconductor device; and a pulsation envelope temperature extraction filter 207 for extracting a pulsation envelope temperature exceeding the maximum value of the pulsation temperature, which depends on the average loss and the pulsation frequency by use of the thermal resistance, the thermal time constant, and a pulsation frequency of the loss. Each of the first to m-th combination partial temperature variation estimation parts 2041 to 204m estimates the partial temperature variation for each combination by adding the average temperature and pulsation envelope temperature.

The device temperature variation estimation part 208 estimates the temperature variation in the semiconductor device by combining the partial temperature variations estimated for the respective combinations.

Referring to FIG. 3, a description will be given of a semiconductor device regarded as a thermal network including three combinations of thermal resistance and thermal time constant. FIG. 3(a) shows a sectional configuration of a semiconductor device. The semiconductor device in FIG. 3(a) has a laminated structure in which a semiconductor chip 11 with the semiconductor device formed thereon is connected to a heat sink 17 with multiple substrates 13, 15, and 16 as well as multiple connection layers 12 and 14 interposed between the semiconductor chip 11 and the heat sink 17. Heat generated from loss in the semiconductor chip 11 is transferred to a coolant 18 in the heat sink 17 via the laminated structure. Hence, multiple points j, c, f, and w are set to define a thermal resistance rjc and thermal time constant rjccj between points j and c; a thermal resistance rcf and thermal time constant rcfcc between points c and f; and a thermal resistance rfw and thermal time constant rfwcf between points f and w. Thus, the semiconductor device in FIG. 3(a) can be regarded as a thermal network including three combinations of a thermal resistance r and a thermal time constant ($\tau=r\cdot c$) as shown in FIG. 3(b).

The partial temperature variation estimation part 204 shown in FIG. 2 shows a case where the semiconductor device is regarded as a thermal network including m combinations of thermal resistance and thermal time constant, based on the thermal network model in FIG. 3. To be specific, the partial temperature variation estimation part 204 shows a case where m+1 points are set between the semiconductor chip 11 and the coolant 18 shown in FIG. 3(a).

FIG. 4 shows waveform examples of components calculated in the calculation processing in FIG. 2. In FIG. 4, the abscissa represents time, and the ordinate represents device temperature. FIG. 4(a) shows actual instantaneous temperatures RDAT and RDBT of two semiconductor devices A and B having different conduction phases, and an estimated device temperature EDT outputted from the device temperature variation estimation part 208. FIG. 4(b) shows an average temperature AVT common to the semiconductor devices A and B, respective differences DRA and DRB between the instantaneous temperatures RDAT and RDBT and the average temperature AVT, and a pulsation envelope temperature WIT common to the semiconductor devices A and B.

As can be seen in FIG. 4(b), the pulsation envelope temperature WIT exceeds the maximum values of the respective differences DRA and DRB between the actual instantaneous temperatures RDAT and RDBT of the semiconductor devices A and B and the average temperature AVT. As can be seen in FIG. 4(a), the estimated device temperature EDT exceeds the maximum values of the actual instantaneous temperatures RDAT and RDBT of the semiconductor devices A and B.

Moreover, the pulsation envelope temperature WIT and the estimated device temperature EDT respectively exceed the maximum values of the differences DRA and DRB and the maximum values of the instantaneous temperature RDAT and RDBT, not only in the saturated state where the average temperature of the semiconductor device is saturated but also in the transit state where the average temperature of the semiconductor device is not saturated.

To be precise, the pulsation envelope temperature changes in such a manner as to envelope the maximum values of the differences DRA and DRB, not only in the saturated state but in the transit state. Similarly, the estimated device temperature EDT changes in such a manner as to envelope the maximum values of the instantaneous temperatures RDAT and RDBT.

To be more precise, the pulsation envelope temperature WIT form a curved line moved for just a predetermined temperature above an envelope of curved lines of the differences DRA and DRB, not only in the saturated state but also in the transit state. Similarly, the estimated device temperature EDT form a curved line moved for just a predetermined temperature above an envelope of curved lines of the instantaneous temperatures RDAT and RDBT.

First Comparative Example

FIGS. 12(a) and 12(b) are graphs showing examples of estimated device temperatures of a first comparative example. The first comparative example is the technique disclosed in Patent Literature 1. The ordinate in FIG. 12(a) represents Loss generated in the semiconductor device, while the ordinate in FIG. 12(b) represents the temperature of the semiconductor device, and the abscissa represents time in both graphs. FIG. 12(a) shows temporal variations RAL and RBL in losses occurring in semiconductor devices A and B, and average values AVL; and FIG. 12(b) shows an estimated device temperature edt, an average temperature AVT of the semiconductor devices A and B, and instantaneous temperatures RDAT and RDBT of the semiconductor devices A and B.

Before time t0, loss is 0 in both of the semiconductor devices A and B, and the temperature is saturated. After the time t0, the motor is powered on, a certain amount of average loss occurs, and the device temperature rises toward the saturated state.

Although the average loss in a period of a current is the same for the semiconductor devices A and B, the instantaneous loss depending on the motor revolution angle transit differently since the two have different conduction phases. Moreover, as for the temperatures of the semiconductor devices A and B, the average temperature AVT calculated from the average loss in a period of a current is common to the semiconductor devices A and B, whereas the instantaneous temperature pulsate.

As shown in FIGS. 12(a) and 12(b), in a region where the motor revolution speed of the three-phase AC motor 105 is low, for example, when a certain amount of loss occurs during a time period sufficiently longer than a time constant of temperature variation in the semiconductor device, a saturated state occurs in which the average temperature of the semiconductor device is saturated. In the technique disclosed in Patent Literature 1, a temperature exceeding the maximum temperature of the pulsating temperature can be estimated, and thus the semiconductor device can be protected. However, in a transit state in which the amount of loss varies during a time period shorter than the time constant of temperature variation in the semiconductor device and thus the average temperature of the device is not saturated, the maximum value of the pulsating temperature exceeds the estimated temperature, and the device cannot be protected.

Meanwhile, the controller 106 of the power converter according to the first embodiment of the present invention is capable of effectively protecting the semiconductor device from heat by estimating a temperature exceeding the maximum value of the pulsating temperature, not only in the average-temperature saturated state, but also in the average-temperature transit state.

Further, in the first embodiment of the present invention, the semiconductor device is regarded as a thermal network including two or more combinations of thermal resistance and thermal time constant, the partial temperature variation for each combination is estimated, and the temperature variation in the semiconductor device is estimated by combining the partial temperature variations estimated for the respective combinations. This makes it possible to improve the accuracy in estimating the temperature of the semiconductor device.

Second Comparative Example

A second comparative example is a technique disclosed in Japanese Patent Application Publication No. Hei 9-233832. In the second comparative example, using the loss of a semiconductor device, the temperature of the semiconductor device is sequentially calculated at a period short enough to detect variation in an output current of an inverter. The higher the revolution speed of a motor, the larger the rate of variation in the output current becomes, requiring a shorter calculation period. Moreover, a temperature need to be estimated independently for the number of different current flowing patterns and switching patterns of the semiconductor device. In other words, the amount of calculation increases in proportion to the number of phases. For this reason, the calculation load in a CPU of a controller increases.

Meanwhile, since the first embodiment of the present invention uses the average loss of the semiconductor device, it suffices that the loss be calculated at a calculation period (2 ms or more) in which variation in the motor torque can be detected. Thus, the calculation load can be reduced.

Note that the first embodiment is not limited to the case where a semiconductor device is regarded as a thermal network including two or more combinations of thermal resistance and thermal time constant. The semiconductor device may be regarded as a thermal network including a single combination of thermal resistance and thermal time constant. In this case, the processing of combining multiple partial temperature variations estimated for respective combinations becomes unnecessary, and the partial temperature variation of the above single combination is directly used as the temperature variation in the semiconductor device to make an estimation. Thus, the calculation load of a controller 106 can be reduced.

Second Embodiment

Figure 5:
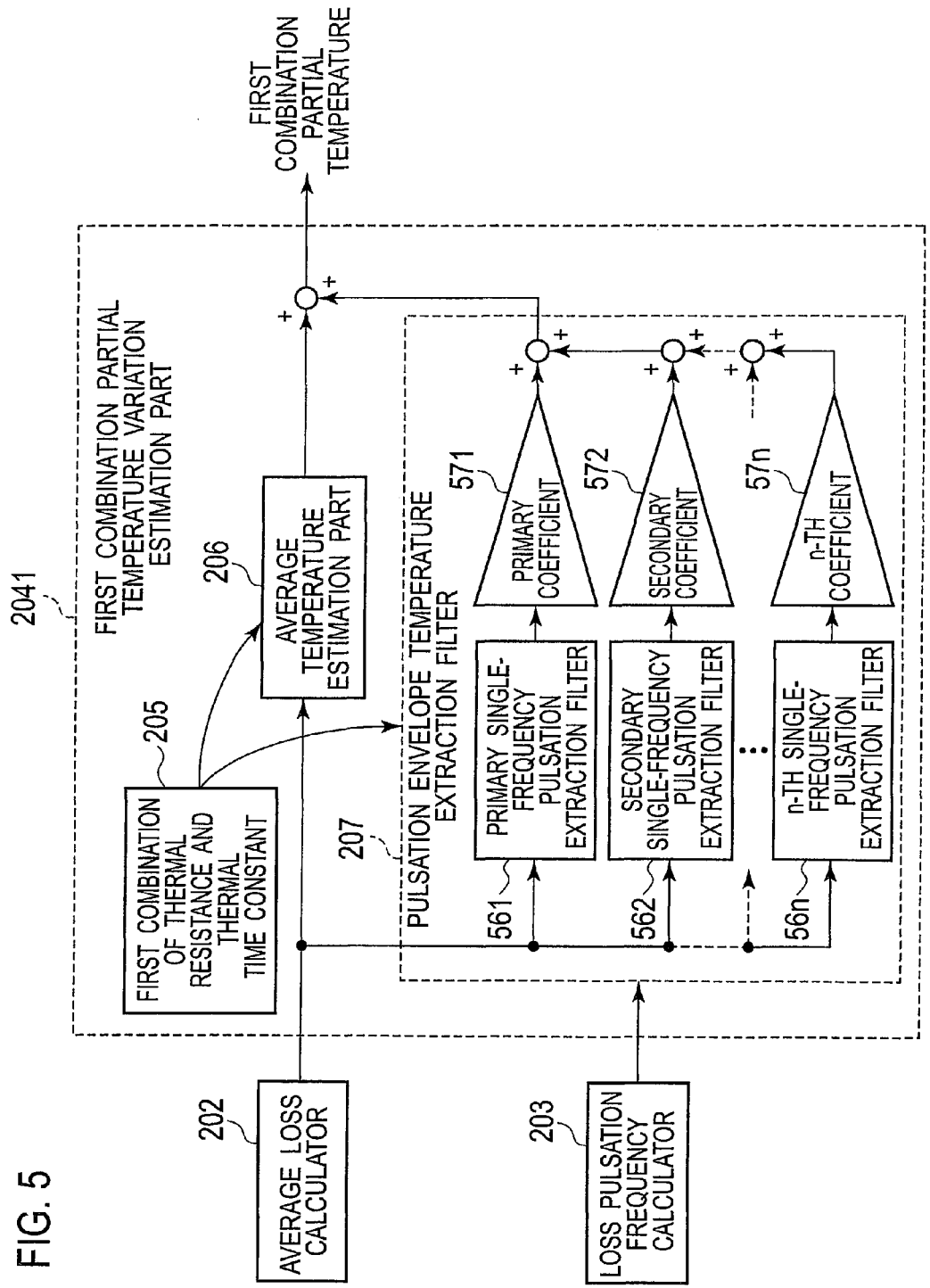
FIG. 5 is a block diagram showing a first example of a detailed configuration of a pulsation envelope temperature extraction filter 207 included in a first combination partial temperature variation estimation part 2041.

Referring to FIG. 5, a description will be given of an example of a detailed configuration of a pulsation envelope temperature extraction filter 207 included in each of first to m-th combination partial temperature variation estimation parts 2041 to 204$m$. The pulsation envelope temperature extraction filter 207 included in the first combination partial temperature variation estimation part 2041 is described as an example in this description, and the pulsation envelope temperature extraction filter 207 included in the second to m-th combination partial temperature variation estimation parts 2042 to 204$m$ have similar configurations. In addition, the configuration of other calculation processing in a controller 106 of FIG. 2 is similar to that in the first embodiment, and thus illustration and descriptions are partially omitted.

The pulsation envelope temperature extraction filter 207 extracts a pulsation envelope temperature by: extracting a partial filter for each frequency component by performing a Fourier series expansion for a loss waveform of the semiconductor device; and combining the results of calculations using the extracted partial filters.

The partial filter for each frequency component is configured on the basis of a thermal resistance, a thermal time constant, and a frequency corresponding to the frequency component. In addition, filter outputs of respective frequency components are combined according to a Fourier coefficient in the Fourier series expansion.

Specifically, the pulsation envelope temperature extraction filter 207 includes a single-frequency pulsation extraction filter (partial filter) for calculating a single-frequency pulsation envelope temperature for each order of the loss pulsation frequency in the loss waveform of the semiconductor device. Here, as one example, a description is given of a case where the pulsation envelope temperature extraction filter 207 includes a primary single-frequency pulsation extraction filter 561, a secondary single-frequency pulsation extraction filter 562, . . . , and an n-th single-frequency pulsation extraction filter 56n for respectively calculating primary to n-th single-frequency pulsation envelope temperatures.

The pulsation envelope temperature is calculated by respectively multiplying the primary to n-th single-frequency pulsation envelope temperatures by primary, secondary, . . . , and n-th Fourier coefficients 571, 572, . . . , and 57n, and then combining the results. Note that the primary to n-th Fourier coefficients 571 to 57n correspond to the orders of the loss pulsation frequency obtained by performing a Fourier series expansion for the loss waveform of the semiconductor device. Then, the partial temperature of the first combination is calculated by combining the calculated pulsation envelope temperature and the average temperature calculated by the average temperature estimation part 206.

Thus, in the second embodiment, the pulsation envelope temperature extraction filter 207 extracts a partial filter for each frequency component by performing a Fourier series expansion for the loss waveform of the semiconductor device, and then extracts the pulsation envelope temperature by combining the results of calculations using the extracted partial filters. This makes it possible to improve the accuracy in estimating the temperature variation in the semiconductor device.

Modified Example of Second Embodiment

A pulsation envelope temperature extraction filter 207 may extract the pulsation envelope temperature by combining the results of calculations using the single-frequency pulsation extraction filters of only the primary frequency component, among the single-frequency pulsation extraction filters of the respective frequency components extracted by performing the Fourier series expansion for the loss waveform of the semiconductor device. This makes it possible to avoid lowering in the accuracy of estimating the temperature variation while reducing the calculation load of the pulsation envelope temperature extraction filter 207.

For example, in FIG. 5, the pulsation envelope temperature extraction filter 207 multiplies the primary single-frequency pulsation envelope temperature extracted from a primary single-frequency pulsation extraction filter 561 by a primary Fourier coefficient 571, and directly uses the result as the pulsation envelope temperature.

Third Embodiment

Figure 6:
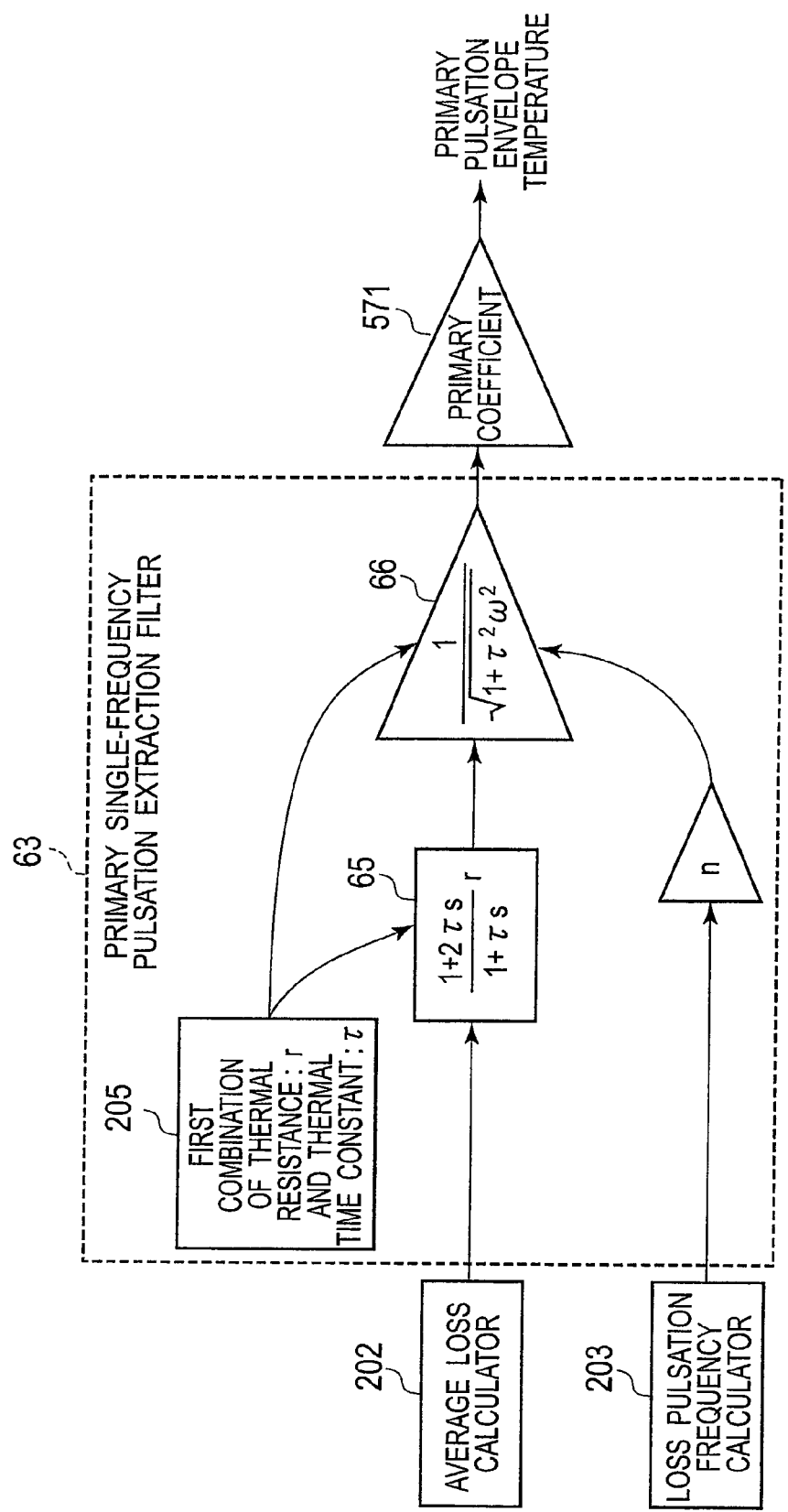
FIG. 6 is a block diagram showing a first example of a detailed configuration of a primary single-frequency pulsation extraction filter 561 (partial filter) of FIG. 5.

Referring to FIG. 6, a description will be given of an example of a detailed configuration of a primary single-frequency pulsation extraction filter 561 (partial filter) of FIG. 5. The primary single-frequency pulsation extraction filter 561 is described as an example in this description, and a secondary single-frequency pulsation extraction filter 562, . . . , and n-th single-frequency pulsation extraction filter 56n have similar configurations. In addition, the configuration of other calculation processing in a controller 106 of FIG. 2 is similar to that in the first embodiment, and thus illustration and descriptions are partially omitted.

As shown in FIG. 6, a primary single-frequency pulsation extraction filter 63 includes a phase advance compensator 65 dependent on a thermal time constant τ, and a frequency dependent gain (gain) 66 dependent on a thermal resistance r, the thermal time constant τ, and a frequency of each filter 63. The frequency dependent gain 66 is set smaller with a smaller thermal resistance r, set smaller with a larger thermal time constant τ, and set smaller with a higher frequency of each filter 63. Moreover, a cutoff frequency is set lower with a larger thermal time constant τ, and set lower with a lower frequency of each filter 63.

In the configuration (Formulae) of the phase advance compensator 65 in FIG. 6, τ represents the thermal time constant, and r represents the thermal resistance. In the configuration (formulae) of the frequency dependent gain 66 in FIG. 6, ω represents a frequency obtained by multiplying a pulsation frequency of loss in a semiconductor device by the order (n times).

A primary single-frequency pulsation envelope temperature can be calculated by subjecting an average loss in the semiconductor device, which is calculated by an average loss calculator 202, to calculation processing shown in the phase advance compensator 65 and the frequency dependent gain 66.

By similarly calculating secondary to n-th single-frequency pulsation envelope temperatures and combining them together, the pulsation envelope temperature in FIG. 5 is obtained. The partial temperature of the first combination is calculated by further combining the pulsation envelope temperature and the average temperature.

The configurations (formulae) of the phase advance compensator 65 and the frequency dependent gain 66 shown in FIG. 6 will be described. Assume a case where loss of the semiconductor device is p=0 at time t<0, and where a loss p is defined by formula (1) at time t≥0.

[Formula 1]

$$p = \sin(\omega t + \theta) \quad (1)$$

In a heating system expressed as the thermal resistance r and the thermal time constant τ, temperature T is expressed by formula (2). Note that cos φ and sin φ in formula (2) are expressed by formula (3).

[Formula 2]

$$T = \frac{\cos(\omega t + \theta + \phi) - e^{-\frac{t}{\tau}} \times \cos(\theta + \phi)}{\sqrt{1 + \tau^2 \omega^2}} r \quad (2)$$

-continued

[Formula 3]

$$\cos\phi = \frac{1}{\sqrt{1+\tau^2\omega^2}}, \sin\phi = -\frac{\tau\omega}{\sqrt{1+\tau^2\omega^2}} \quad (3)$$

An envelope temperature obtained by substituting formula (4) into formula (2) is expressed as formula (5).

[Formula 4]

$$\cos(\omega t + \theta + \phi) = 1, \cos(\theta + \phi) = -1 \quad (4)$$

[Formula 5]

$$T = \frac{e^{-\frac{t}{\tau}} + 1}{\sqrt{1+\tau^2\omega^2}}r \quad (5)$$

A transfer function for calculating an envelope temperature T by taking the Laplace transform of Formula (5) is expressed by Formula (6).

[Formula 6]

$$\frac{1}{\sqrt{1+\tau^2\omega^2}} \frac{1+2\tau s}{1+\tau s}r \quad (6)$$

It can be seen that formula (6) is configured by combining the configurations (formulae) of the phase advance compensator 65 and the frequency dependent gain 66 shown in FIG. 6.

FIG. 7(a) is a graph showing single-frequency pulsation losses SWA and SWB in semiconductor devices A and B; and FIG. 7(b) is a graph showing single-frequency pulsation temperatures SGA and SGB in the semiconductor devices A and B, and a single-frequency pulsation envelope temperature SWI1.

Phase differences occur in the pulsating losses and temperatures between the semiconductor devices A and B. While there is no difference between maximum values of the pulsation losses in FIG. 7(a), when the phase difference increases, a difference occurs between maximum values of the pulsation temperature in FIG. 7(b). Meanwhile, as can be seen from FIG. 7(b), the single-frequency pulsation envelope temperature SWI1 calculated in the third embodiment exceeds the maximum values of the pulsation temperatures of both the semiconductors A and B in the transit state.

As has been described, according to the third embodiment, the primary single-frequency pulsation envelope temperature can be calculated accurately, by providing the phase advance compensator 65 and the frequency dependent gain (gain) 66 in the single-frequency pulsation extraction filter 561 (partial filter).

Fourth Embodiment

Figure 8:
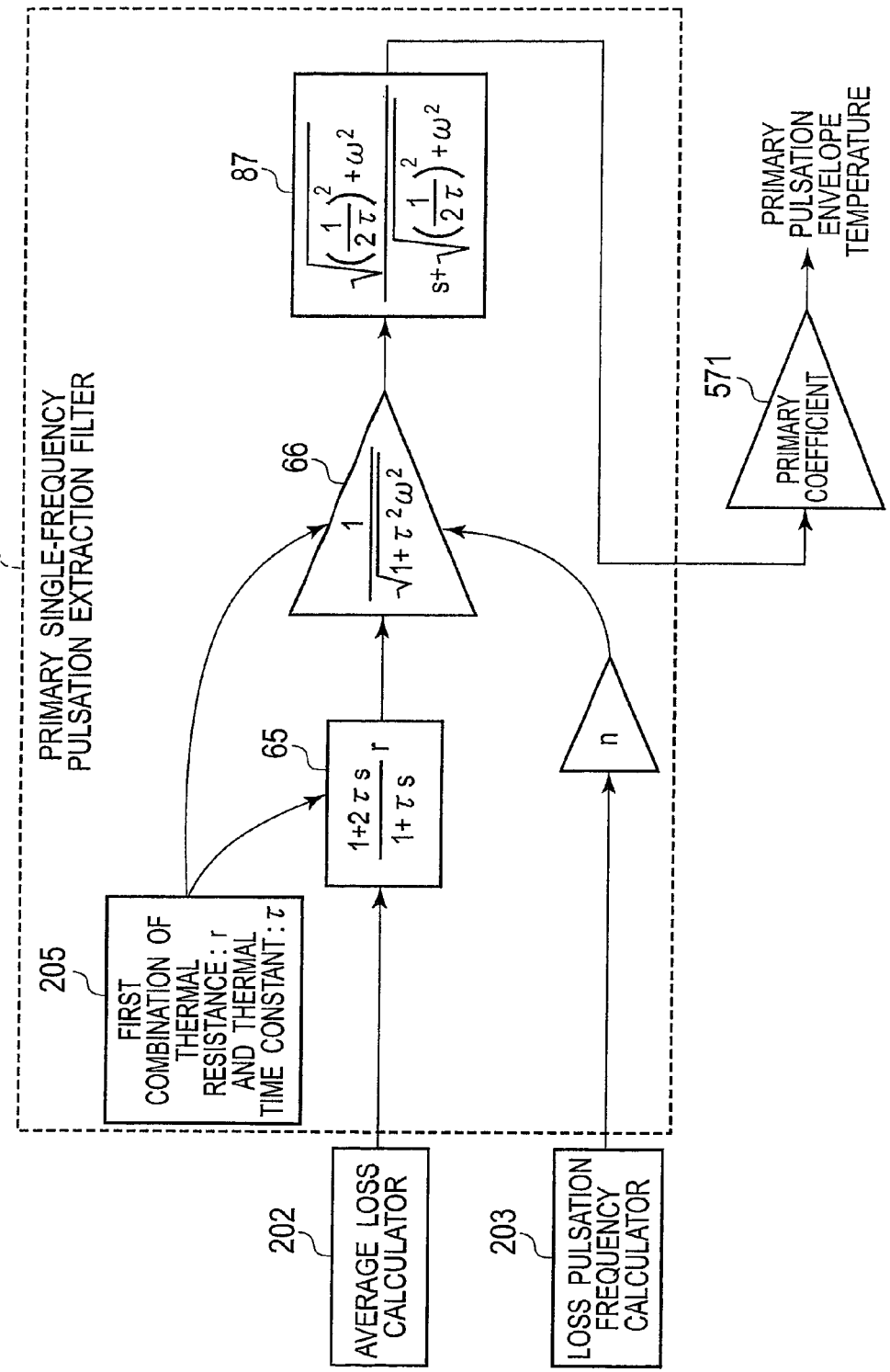
FIG. 8 is a block diagram showing a second example of a detailed configuration of the primary single-frequency pulsation extraction filter 561 (partial filter) of FIG. 5.

Referring to FIG. 8, a description will be given of another example of a detailed configuration of a primary single-frequency pulsation extraction filter 561 (partial filter) of FIG. 5. A primary single-frequency pulsation extraction filter 83 of a fourth embodiment is different from the primary single-frequency pulsation extraction filter 63 of FIG. 6 in that a low-pass filter 87 is further added thereto. The low-pass filter 87 has a cutoff frequency dependent on the thermal time constant and the frequency of each filter 83. Other parts of the configuration are the same with those in FIG. 6.

A primary pulsation envelope temperature obtained by carrying out the calculation processing shown in a frequency dependent gain 66 is passed through the low-pass filter 87.

FIG. 9(a) is a graph showing single-frequency pulsation losses SWA and SWB in semiconductor devices A and B; and FIG. 9(b) is a graph showing single-frequency pulsation temperatures SGA and SGB in the semiconductor devices A and B, and a single-frequency pulsation envelope temperature SWI2.

As in the case of the aforementioned single-frequency pulsation envelope temperature SWI1, the single-frequency pulsation envelope temperature SWI2 calculated in the fourth embodiment exceed the maximum values of the pulsating temperatures of both the semiconductors A and B in the transit state. Moreover, since the maximum value of the single-frequency pulsation envelope temperature SWI2 at the start of the transit state is kept low by the low-pass filter 87, the estimation accuracy can be improved.

Fifth Embodiment

Figure 10:
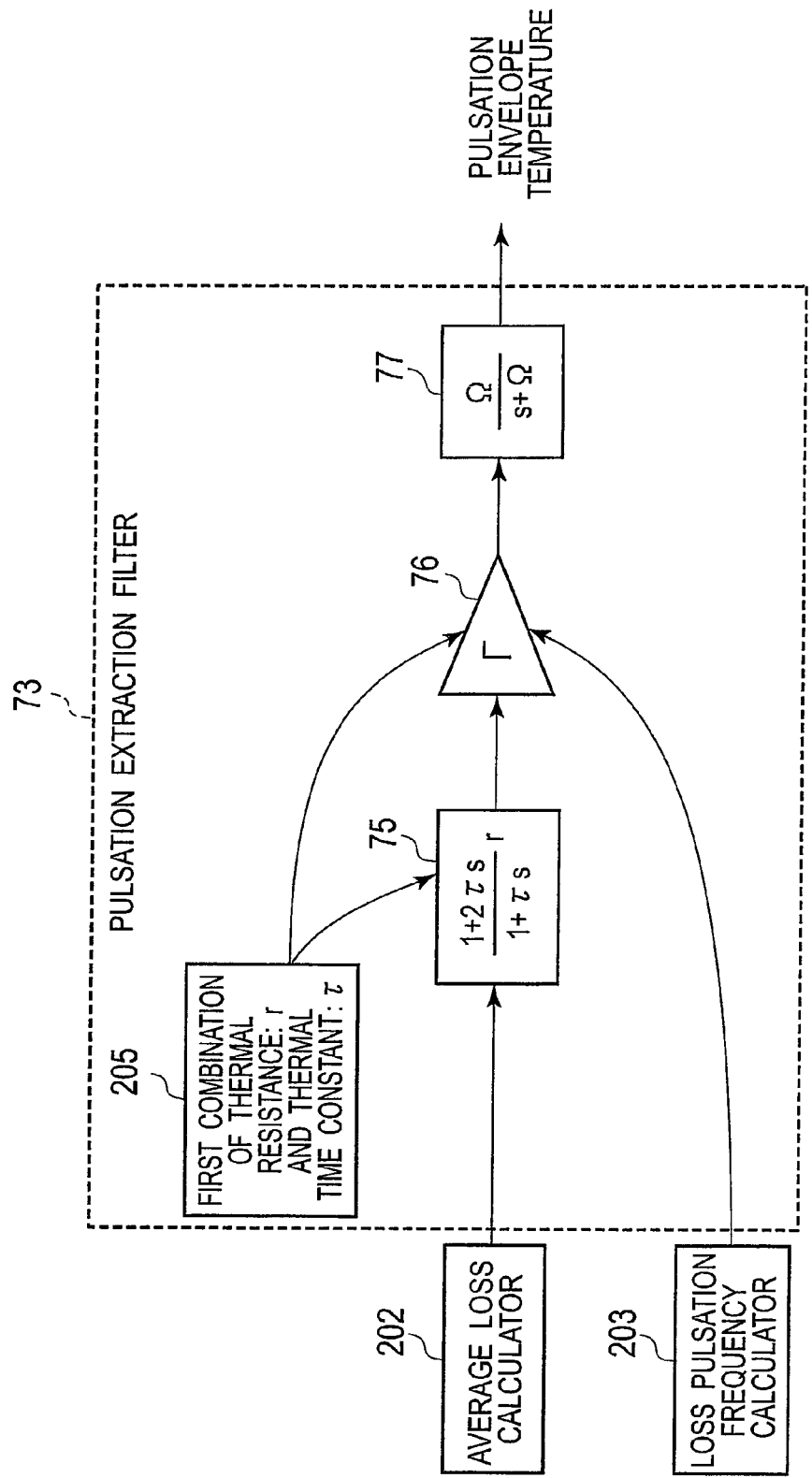
FIG. 10 is a block diagram showing a third example of a detailed configuration of the primary single-frequency pulsation extraction filter 561 (partial filter) of FIG. 5.

Referring to FIG. 10, a description will be given of yet another example of a detailed configuration of a primary single-frequency pulsation extraction filter 561 (partial filter) of FIG. 5. In a fifth embodiment, to reduce the calculation load, a filter configuration is employed in which primary to n-th single-frequency pulsation extraction filters are combined together.

Specifically, a pulsation extraction filter 73 includes a phase advance compensator 75, a frequency dependent gain 76, and a low-pass filter 77. The phase advance compensator 75 is common to the single-frequency pulsation extraction filters, and thus is the same as the phase advance compensator 65 shown in FIGS. 6 and 8.

Meanwhile, a total of the frequency dependent gains of the primary to n-th single-frequency pulsation extraction filters is used as the frequency dependent gain 76. Then, a cutoff frequency being an average weighted by the frequency dependent gains of the respective single-frequency pulsation extraction filters is used as the low-pass filter 77.

Specifically, a variable $\Gamma$ of the frequency dependent gain 76 in FIG. 10 is expressed by formula (7), and a variable $\Omega$ of the low-pas filter 77 is expressed by formula (8). In the formulae, $\omega$ represents the loss pulsation frequency, and $c_k$ represents a k-th Fourier coefficient.

[Formula 7]

$$\Gamma = \sum_{n=1}^{\infty} c_n K_n \quad (7)$$

$$= \sum_{n=1}^{\infty} c_n \frac{1}{\sqrt{1+\tau^2(n\omega)^2}}$$

[Formula 8]

$$\Omega = \frac{1}{\Gamma} \sum_{n=1}^{\infty} c_n K_n \omega_n \quad (8)$$

$$= \frac{1}{\Gamma} \sum_{n=1}^{\infty} c_n K_n \sqrt{\left(\frac{1}{2\tau}\right)^2 + (n\omega)^2}$$

As has been described, according to the fifth embodiment, use of a common frequency dependent gain 76 and low-pass filter 77 as the pulsation extraction filter reduces the calculation load, as compared with the configuration using the respective single-frequency pulsation extraction filters.

Sixth Embodiment

Figure 11:
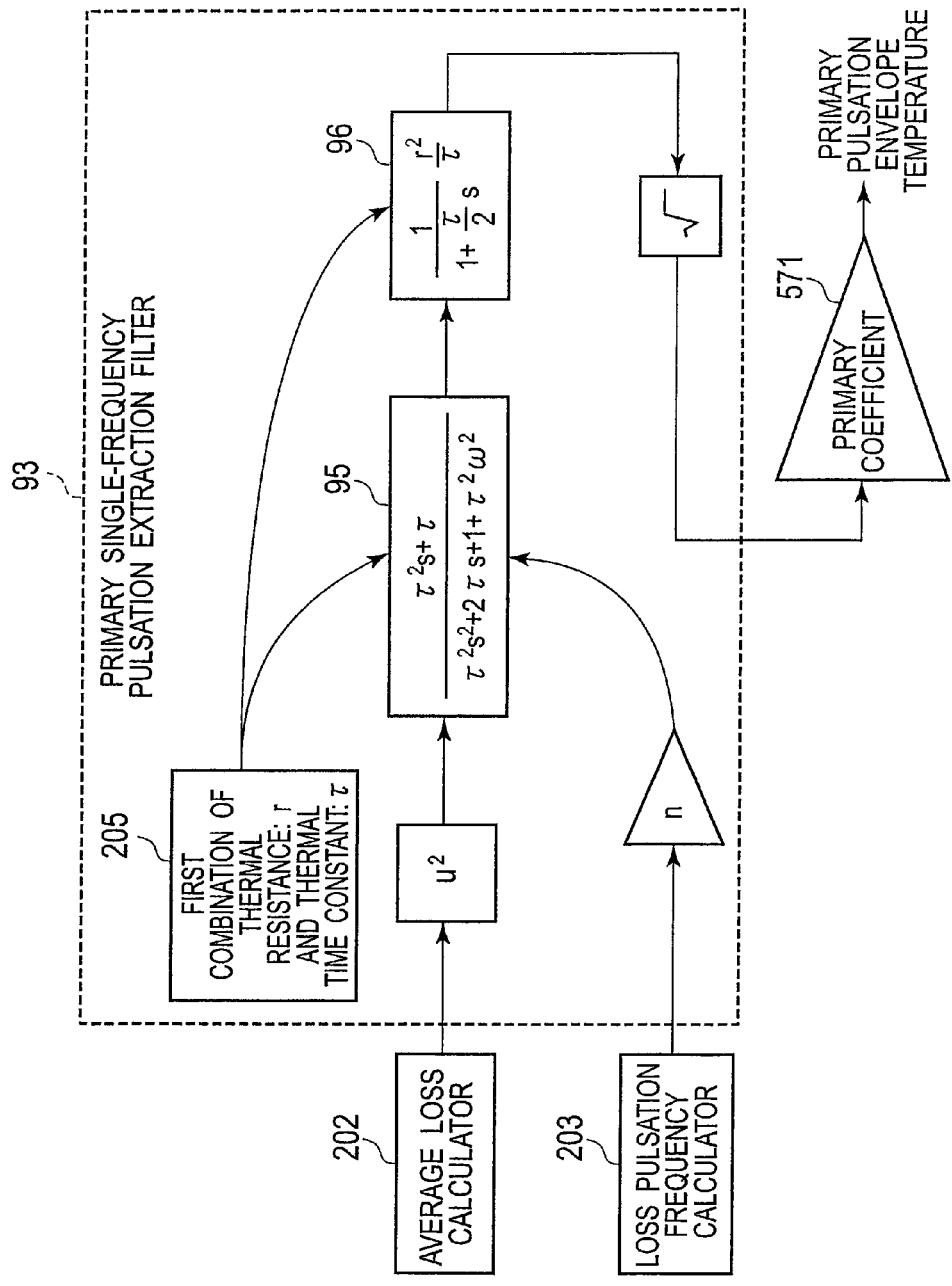
FIG. 11 is a block diagram showing a fourth example of a detailed configuration of the primary single-frequency pulsation extraction filter 561 (partial filter) of FIG. 5.

Referring to FIG. 11, a description will be given of yet another detailed configuration of a primary single-frequency pulsation extraction filter 561 (partial filter) of FIG. 5. The primary single-frequency pulsation extraction filter 561 is described as an example in this description, and a secondary single-frequency pulsation extraction filter 562, . . . , and n-th single-frequency pulsation extraction filter 56*n* have similar configurations. In addition, the configuration of another calculation processing in a controller 106 of FIG. 2 is similar to that in the first embodiment, and thus illustration and descriptions are partially omitted.

A primary single-frequency pulsation extraction filter 93 shown in FIG. 11 has a transfer function different from those of the primary single-frequency pulsation extraction filters shown in FIGS. 6, 8, and 10, while other parts of the configuration are the same.

Specifically, the primary single-frequency pulsation extraction filter 93 includes: a frequency dependent gain (gain) dependent on a thermal resistance, a thermal time constant, and a pulsation frequency; a low-pass filter 96 having a cutoff frequency dependent on a thermal time constant; and a secondary filter having a natural frequency dependent on a thermal time constant and a pulsation frequency. Since both the frequency dependent gain and the secondary filter are dependent of the pulsation frequency, the two are shown as a single configuration (95).

The frequency dependent gain is set smaller with a smaller thermal resistance r, set smaller with a larger thermal time constant τ, and set smaller with a higher pulsation frequency. Moreover, the cutoff frequency is set lower with a larger thermal time constant τ. The natural frequency is set lower with a larger thermal time constant τ, and set lower with a lower pulsation frequency.

In formula (2), instead of substituting formula (4) into formula (2), θ maximizing T is obtained for every t, and mathematical manipulations are carried out to obtain formula (9). Then, a transfer function shown in FIG. 11 can be found by taking the Laplace transform of formula (9).

[Formula 9]

$$T^2 = \frac{e^{-\frac{2t}{\tau}} - 2e^{-\frac{t}{\tau}} \times \cos\omega t + 1}{1 + \tau^2 \omega^2} \quad (9)$$

As has been described, according to the sixth embodiment, the estimation accuracy can be improved with the transfer function of the single-frequency pulsation extraction filter 93 being separately configured as the frequency dependent gain and the secondary filter (95) being dependent on the pulsation frequency, and the low-pass filter 96 being independent of the pulsation frequency.

Seventh Embodiment

A description will be given of another example of a detailed configuration of a pulsation envelope temperature extraction filter 207 included in each of first to m-th combination partial temperature variation estimation parts 2041 to 204*m*. The pulsation envelope temperature extraction filter 207 included in the first combination partial temperature variation estimation part 2041 is described as an example in this description. The pulsation envelope temperature extraction filter 207 included in each of the second to m-th combination partial temperature variation estimation parts 2042 to 204*m* has a similar configuration. Moreover, as in the case of the second embodiment, the pulsation envelope temperature extraction filter 207 includes components for respective orders. The primary components are mainly described below, and secondary to n-th components have similar configurations.

Figure 13:
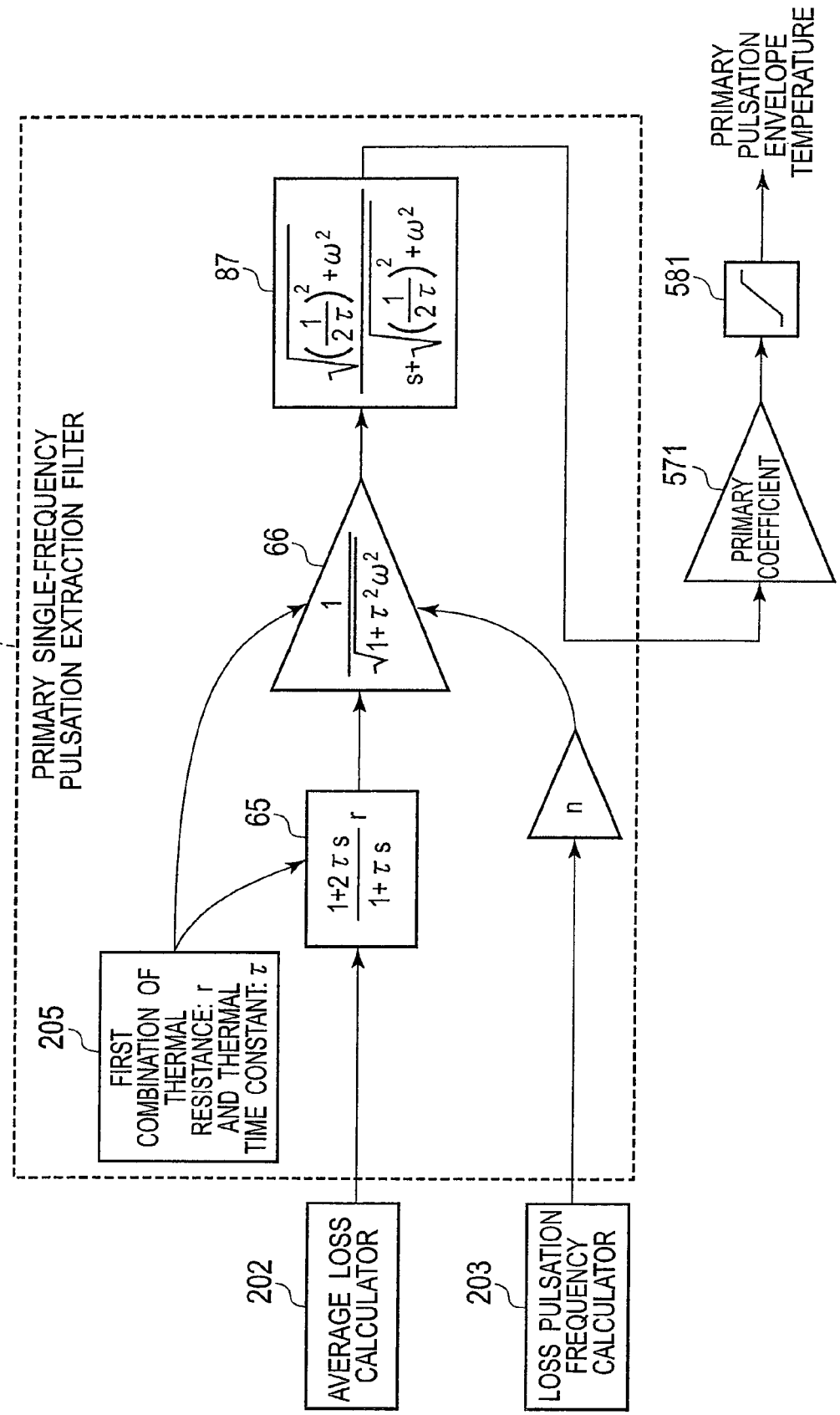
FIG. 13 is a block diagram showing a principle configuration of a pulsation envelope extraction filter 207 of a seventh embodiment.

FIG. 13 is a block diagram showing a principle configuration of the pulsation envelope temperature extraction filter 207 of the seventh embodiment. As a characteristic of the seventh embodiment, the pulsation envelope temperature extraction filter 207 includes, as primary components, a primary limiter 581 in addition to a primary single-frequency pulsation extraction filter 83 and a primary Fourier coefficient 571. The primary limiter 581 is disposed as a subsequent stage of a multiplier for performing multiplication with the primary Fourier coefficient 571. The primary limiter 581 functions as a upper limiter and a lower limiter, and outputs a primary single-frequency pulsation envelope temperature multiplied by the primary Fourier coefficient 571, by limiting the temperature within a range between predetermined upper and lower limit values. Here, as in the case of the fourth embodiment, a primary single-frequency pulsation extraction filter 83 of the seventh embodiment includes a phase advance compensator 65 dependent on a thermal time constant τ, a frequency dependent gain (gain) 66 dependent on the frequency of each filter 63, and a low-pass filter 87 having a cutoff frequency dependent on the thermal time constant and the frequency of each filter 83.

Figure 14:
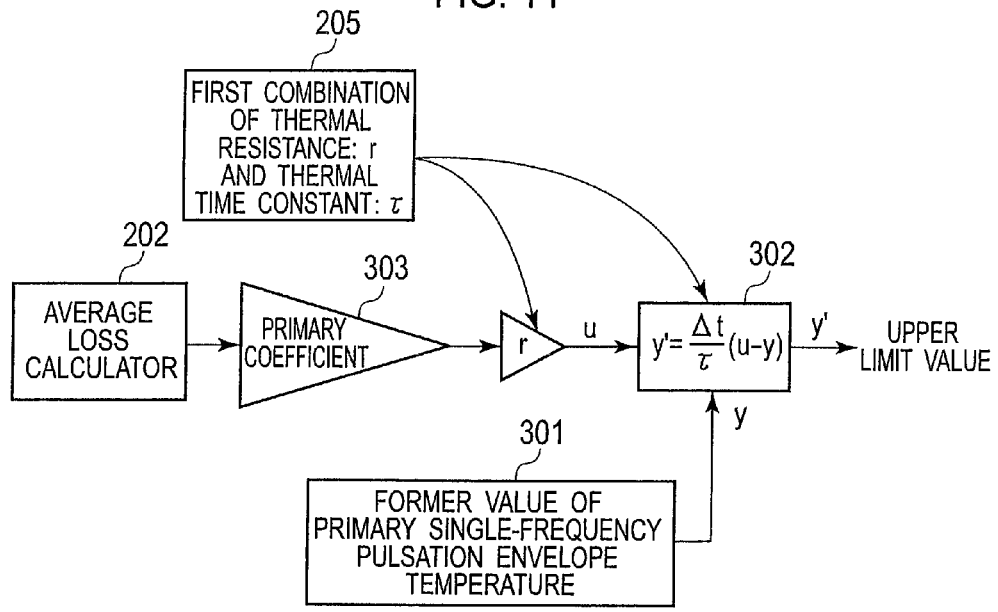
FIG. 14 is a block diagram showing a configuration of an upper limiter for calculating an upper limit value, which is a function of a primary limiter 581 in FIG. 13.

FIG. 14 is a block diagram showing a configuration of the upper limiter for calculating an upper limit value, which is a function of the primary limiter 581. The primary limiter 581 as the upper limiter includes an upper limit value calculator 302, and calculates an upper limit value by use of the average loss in the semiconductor device calculated by an average loss calculator 202, a primary Fourier coefficient 303, and a former value 301 of the primary single-frequency pulsation envelope temperature.

The upper limit value calculator 302 calculates an upper limit value according to formula (10).

[Formula 10]

$$y' = \frac{\Delta t}{\tau}(u - y) \quad (10)$$

In formula (10), y' represents the upper limit value, and u represents a value obtained by multiplying the average loss in the semiconductor device by the primary Fourier coefficient 303 and a thermal resistance r. In addition, y represents the former value 301 of the primary single-frequency pulsation envelope temperature. The y is a value of the primary single-frequency pulsation envelope temperature in the last calculation period, i.e., the primary single-frequency pulsation envelope temperature obtained in a calculation carried out in a period before the calculation currently carried out. In this case, a comparison is made between the value of the primary single-frequency pulsation envelope temperature in the last calculation period and the upper limit value in the last calculation period. If the former is smaller, the former is set as the former value 301 of the primary single-frequency pulsation envelope temperature. If the former is larger, the latter is set as the former value 301 of the primary single-frequency pulsation envelope temperature. Furthermore, if the former is larger, the upper limit value calculator 302 functions as a general first-order lag filter.

Figure 15:
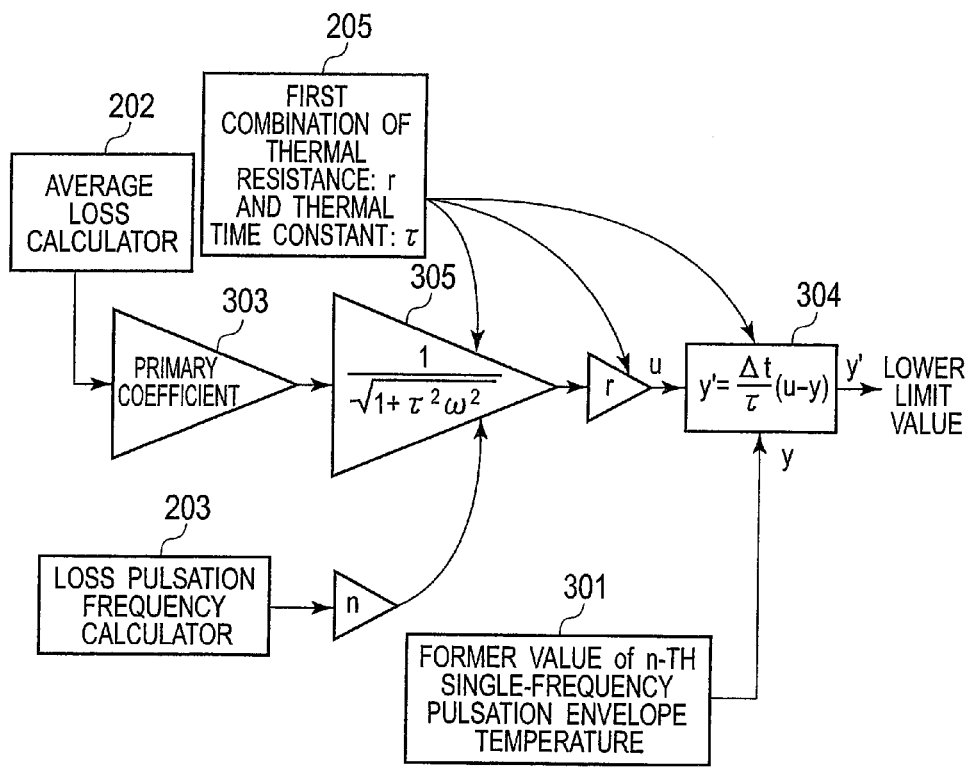
FIG. 15 is a block diagram showing a configuration of a lower limiter for calculating a lower limit value, which is a function of the primary limiter 581 in FIG. 13.

FIG. 15 is a block diagram showing a configuration of the lower limiter for calculating a lower limit value, which is a function of the primary limiter 581. The primary limiter 581 as the lower limiter includes a lower limit value calculator 304, and calculates a lower limit value by use of the average loss in the semiconductor device calculated by the average loss calculator 202, the primary Fourier coefficient 303, a frequency dependent gain 305, and the former value 301 of the primary single-frequency pulsation envelope temperature.

The lower limit value calculator 304 calculates a lower limit value according to formula (10) described above. In this case, in formula (10), y' represents the lower limit value, u represents a value obtained by multiplying the average loss in the semiconductor device by the primary Fourier coefficient 303, the frequency dependent gain 305, and the thermal resistance r. Here, the frequency dependent gain 305 corresponds to the frequency dependent gain 66 shown in FIG. 13. In addition, y represents the former value 301 of the primary single-frequency pulsation envelope temperature. In this case, a comparison is made between the value of the primary single-frequency pulsation envelope temperature in the last calculation period and the lower limit value in the last calculation period. If the former is larger, the former is set as the former value 301 of the primary single-frequency pulsation envelope temperature. If the former is smaller, the latter is set as the former value 301 of the primary single-frequency pulsation envelope temperature. Furthermore, if the latter is smaller, the lower limit value calculator 304 functions as a general first-order lag filter.

The primary limiter 581 outputs the primary single-frequency pulsation envelope temperature, by limiting it within a range between the upper limit value calculated by the upper limiter function and the lower limit value calculated by the lower limiter function. In other words, if an inputted value is smaller than the upper limit value and larger than the lower limit value, the primary limiter 581 directly outputs the inputted value as the primary single-frequency pulsation envelope temperature. Meanwhile, if an inputted value is not smaller than the upper limit value, the primary limiter 581 outputs the upper limit value instead of the inputted value as the primary single-frequency pulsation envelope temperature. If the inputted value is not larger than the lower limit value, the primary limiter 581 outputs the lower limit value instead of the inputted value as the primary single-frequency pulsation envelope temperature.

The calculation described above is similarly carried out within the rage between the upper and lower limit values in each of the secondary to n-th single-frequency pulsation envelope temperatures. The pulsation envelope temperature of FIG. 5 can be obtained by combining these temperatures. The partial temperature of the first combination can be calculated by further combining the pulsation envelope temperature and the average temperature.

Hereinbelow, details of the upper limiter being a function of the primary limiter 581 will be described. Firstly, in the primary single-frequency pulsation extraction filter 83 (see FIG. 13), a serial path from the phase advance compensator 65 to the low-pass filter 87 via the frequency dependent gain (gain) 66 is focused.

Figure 16:
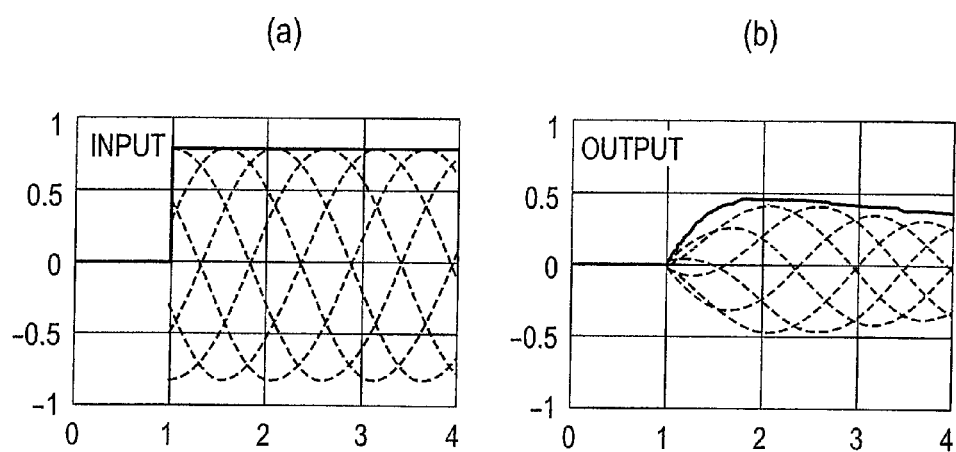
FIG. 16(a) is a graph exemplifying input waveforms when frequency (a frequency obtained by multiplying a pulsation frequency of loss in a semiconductor device by the order (n times)) ω≠0.
FIG. 16(b) is a graph exemplifying output waveforms when frequency ω≠0.
Figure 17:
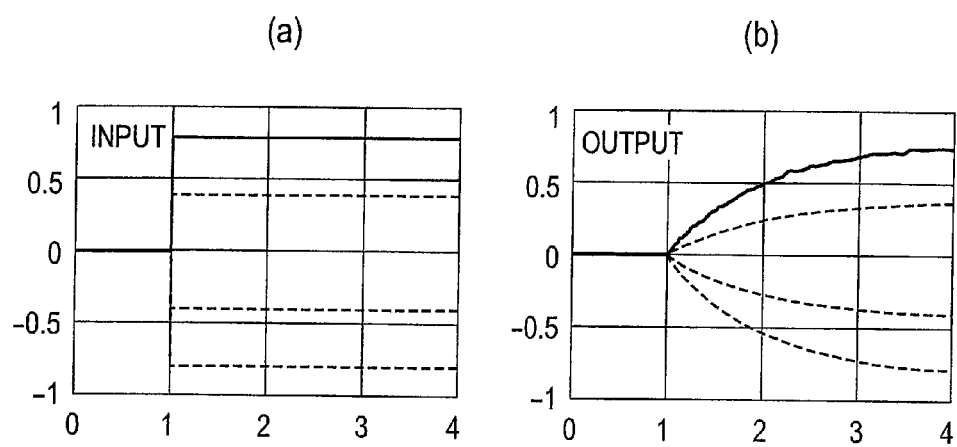
FIG. 17(a) is a graph exemplifying input waveforms when frequency ω≠0.
FIG. 17(b) is a graph exemplifying output waveforms when frequency ω≠0.

To begin with, FIG. 16 exemplifies input and output waveforms when frequency ω≠0. In this case, frequency ω indicates a frequency obtained by multiplying a pulsation frequency of loss in the semiconductor device by the order (n times). In FIG. 16, the broken lines indicate input (instantaneous loss) and output (instantaneous temperature) for six phases. The solid lines indicate a case to which the upper limiter of the primary limiter 581 is not applied, i.e., the input (amplitude of average loss) and output (primary single-frequency pulsation envelope temperature) of the primary single-frequency pulsation extraction filter 83 shown in the fourth embodiment. Meanwhile, FIG. 17 shows input and output waveforms when frequency ω=0. In FIG. 17, the broken lines indicate input (instantaneous loss) and output (instantaneous temperature) for six phases. The solid lines indicate the input (amplitude of average loss) and output (primary single-frequency pulsation envelope temperature) of the primary single-frequency pulsation extraction filter 83 shown in the fourth embodiment.

Figure 18:
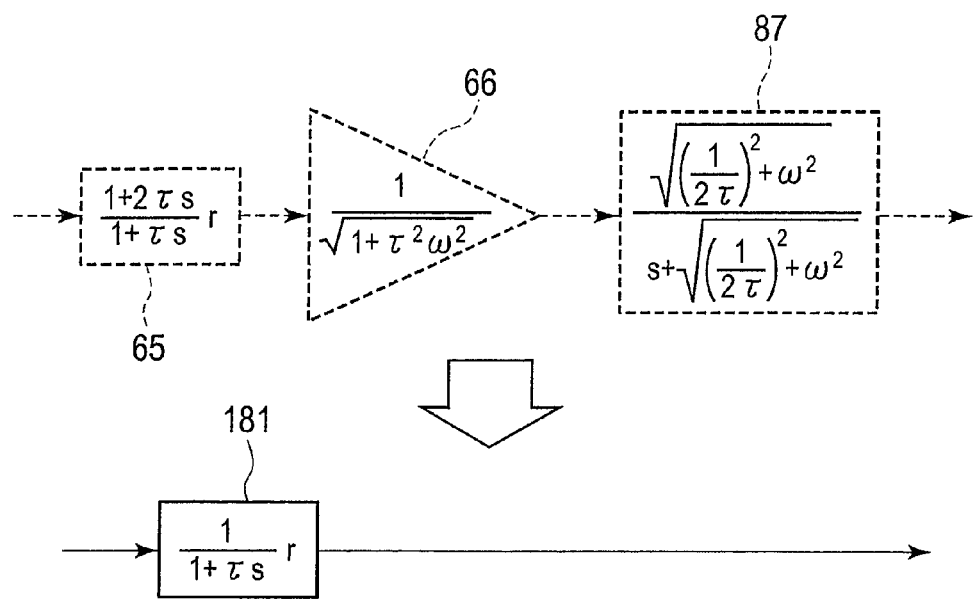
FIG. 18 is an equivalent block diagram of a serial path from a phase advance compensator 65 to a low-path filter 87.
Figure 19:
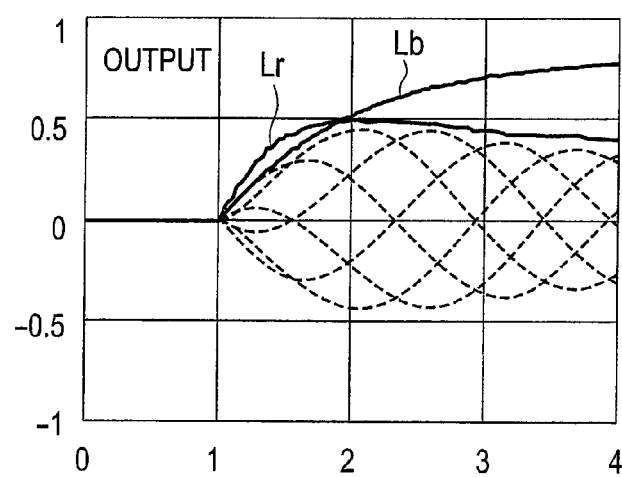
FIG. 19 is a diagram showing a result of superimposing output waveforms when frequency ω=0 on output waveforms when frequency ω≠0 (only primary single-frequency pulsation envelope temperature).

The serial path from the phase advance compensator 65 to the low-pass filter 87 can be regarded as being equivalent to a block (equivalent block) 181 shown in a lower part of FIG. 18 when frequency ω=0. Here, FIG. 19 is a graph showing a result of superimposing, on the output waveforms when frequency ω≠0, only the primary single-frequency pulsation envelope temperature among the output waveforms when frequency ω=0. In FIG. 19, a solid line Lb indicates the primary single-frequency pulsation envelope temperature when frequency ω=0, and a solid line Lr indicates the primary single-frequency pulsation envelope temperature when frequency ω≠0.

As a physical phenomenon, a partial temperature when frequency ω=0 (limited to only the partial temperature of a conductive phase where the current value is maximized (solid line Lb)) becomes larger than a partial temperature when frequency ω≠0 (partial temperature for all conductive phases (broken line)). However, as a result of envelope approximation (solid line Lr), a reverse phenomenon in which the solid line Lr temporarily exceeds the solid line Lb occurs immediately after the temperature rise, as shown in FIG. 19. Accordingly, the temperature rise characteristic when frequency ω=0 is used as a limiter to reduce envelope approximation errors.

The equivalent block 181 shown in the lower part of FIG. 18 is converted in a difference form using a calculation period Δt of the controller, and expressed as an output variation amount (Δy/Δt) shown in formula (11).

[Formula 11]

$$\frac{\Delta y}{\Delta t} = \frac{1}{\tau}(r \cdot u - y) \quad (11)$$

The variation amount of formula (11) indicates the variation amount when frequency ω=0, and tends to become larger than the output variation amount when frequency ω≠0. Hence, in the seventh embodiment, the output variation amount is sequentially calculated for every calculation period, and is used as the upper limit value.

FIG. 20 is a diagram showing effects of the upper limiter of the primary limiter 581. In FIG. 20(a), the solid line Lb indicates the primary single-frequency pulsation envelope temperature in a case where the upper limiter is not applied. The solid line Lr indicates the primary single-frequency pulsation envelope temperature in a case where the upper limiter is applied. As can be seen from FIG. 20(a), the primary single-frequency pulsation envelope temperature in the case where the upper limiter is applied are calculated as a waveform accurately enveloping the instantaneous temperature of the respective phases indicated by the broken lines. In other words, the upper limiter of the primary limiter 581 is capable of effectively reducing envelope approximation errors. Here, FIG. 20(*b*) is a block configuration diagram schematically showing an explanation on the aforementioned upper limiter.

Next, details of the lower limiter being a function of the primary limiter 581 will be described. Firstly, as in the case of the above description on the upper limiter, the serial path from the phase advance compensator 65 to the low-pass filter 87 via the frequency dependent gain (gain) 66 in the primary single-frequency pulsation extraction filter 83 (see FIG. 13) is focused.

Figure 21:
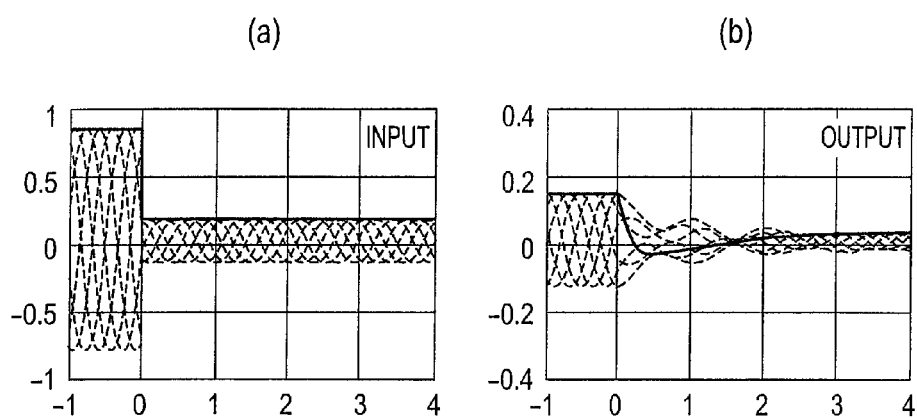
FIG. 21(a) is a graph exemplifying input waveforms under a certain condition.
FIG. 21(b) is a graph exemplifying output waveforms under a certain condition.

To begin with, FIG. 21 exemplifies input and output waveforms under a certain condition. In FIG. 21, the broken lines indicate input (instantaneous loss) and output (instantaneous temperature) for six phases. The solid lines indicate a case to which the lower limiter of the primary limiter 581 is not applied, i.e., the input (amplitude of average loss) and output (primary single-frequency pulsation envelope temperature) of the primary single-frequency pulsation extraction filter 83 shown in the fourth embodiment. As can be seen from FIG. 21, when the input (amplitude of average loss) shows the decreasing trend, the envelope temperature calculation does not function successfully in the transit state due to effects of the phase advance compensator 65. The primary single-frequency pulsation envelope temperature falls below the instantaneous temperature (actual temperature). In this case, the semiconductor device may not be appropriately protected from heat.

Figure 22:
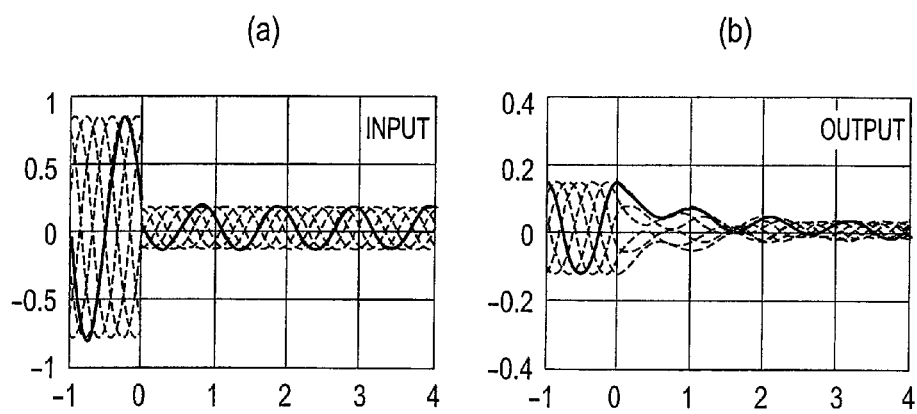
FIG. 22(a) is a graph showing input (instantaneous loss) waveforms for six phases shown in FIG. 21(a)
FIG. 22(b) is a graph showing output (instantaneous temperature) waveforms shown in FIG. 21(b).

FIG. 22 shows input and output waveforms indicating input (instantaneous loss) and output (instantaneous temperature) for six phases shown in FIG. 21. In FIG. 22, the solid lines indicate input and output waveforms of a phase having the maximum temperature upon switching of the average loss (simply referred to below as "maximum phase"). The broken lines indicate input and output waveforms of the other phases. By focusing on the transition of the solid line, it can be seen that an envelope of the output exceeds outputs of all the conductive phases. Hence, this characteristic is used as the lower limiter in the seventh embodiment.

Figure 23:
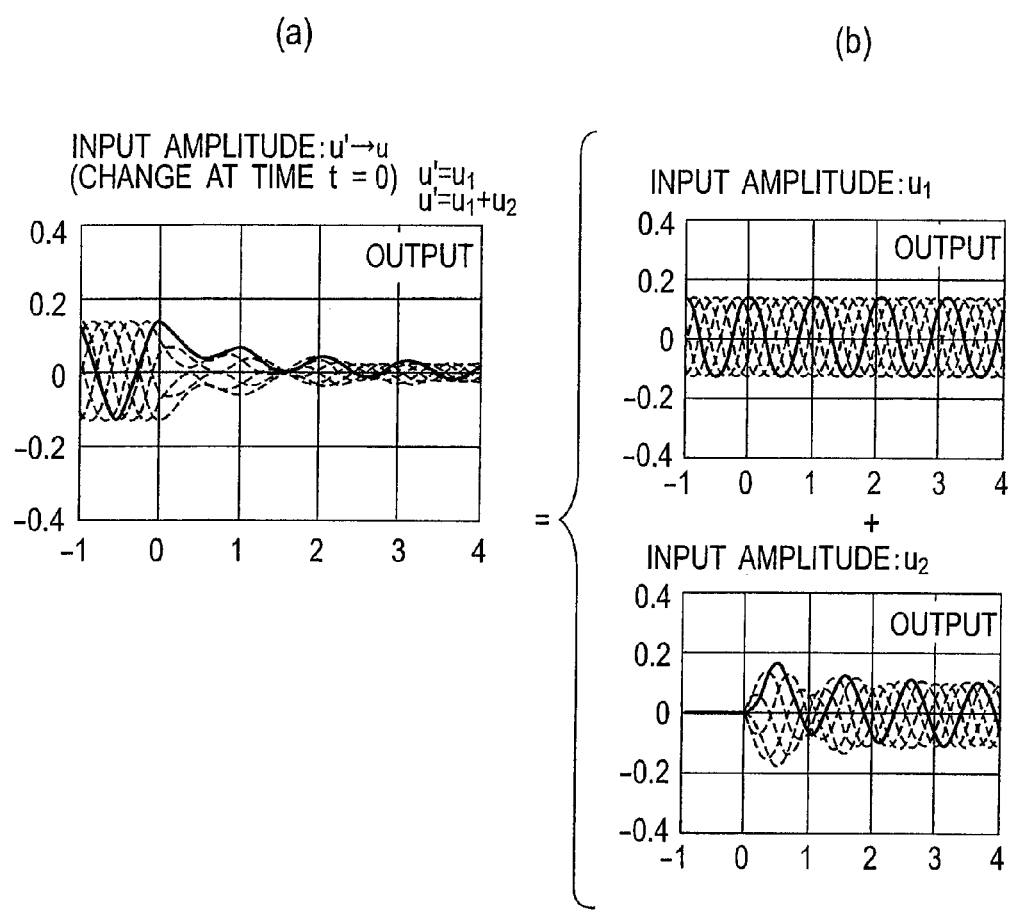
FIG. 23(a) is a graph corresponding to FIG. 22(b), showing output waveforms before breaking down the input amplitude into u1 and u2.
FIG. 23(b) is a graph showing output waveforms after breaking down the input amplitude of FIG. 23 (a) into u1 and u2.

Firstly, as shown in FIG. 23, defining that the input amplitude changes from u' to u at time t=0 (abscissa), the input amplitude is broken down into two input amplitudes u1 and u2 satisfying u'=u1 and u=u1+u2. Then, a formula is obtained for each of output waveforms corresponding to the broken down input amplitudes u1 and u2.

An entire output f1 corresponding to the input amplitude u1 is expressed as formula (13), which is obtained by eliminating the transient item from formula (12) corresponding to the basic formula (aforementioned formula (2)) of input/output response.

[Formula 12]

$$f(\theta, t) = \frac{\cos(\omega t + \theta + \phi) - e^{-\frac{t}{\tau}} \cdot \cos(\theta + \phi)}{\sqrt{1 + \tau^2 \omega^2}} r \cdot u_1 \quad (12)$$

[Formula 13]

$$f_1(\theta, t) = \frac{\cos(\omega t + \theta + \phi)}{\sqrt{1 + \tau^2 \omega^2}} r \cdot u_1 \quad (13)$$

Furthermore, in the maximum phase indicated by the solid lines, a conductive phase angle θ is maximized at time t=0. This indicates that θ=−φ. In this case, the output of the maximum phase indicated by the solid line (FIG. 24(*a*)) corresponding to the input amplitude u1 is expressed in formula (14).

[Formula 14]

$$f_1(-\phi, t) = \frac{\cos \omega t}{\sqrt{1 + \tau^2 \omega^2}} r \cdot u_1 \quad (14)$$

On the other hand, an entire output f2 corresponding to the input amplitude u2 is expressed by a similar concept as the aforementioned formulae (12) and (13). Moreover, by assigning the conductive phase angle θ=−φ, the output of the maximum phase indicated by the solid line (FIG. 24(*b*)) corresponding to the input amplitude u2 is expressed in formula (15).

[Formula 15]

$$f_2(-\phi, t) = \frac{\cos \omega t - e^{-\frac{t}{\tau}}}{\sqrt{1 + \tau^2 \omega^2}} r \cdot u_2 \quad (15)$$

Thus, the output of the maximum phase indicated by the solid line in FIG. 24(*c*) is expressed in formula (16), as an output waveform f3 in which the entire output f1 and the entire output f2 are combined.

[Formula 16]

$$\begin{aligned}f_3(t) &= f_1(t) + f_2(t) \\ &= \frac{\cos \omega t}{\sqrt{1 + \tau^2 \omega^2}} r \cdot u_1 + \frac{\cos \omega t - e^{-\frac{t}{\tau}}}{\sqrt{1 + \tau^2 \omega^2}} r \cdot u_2 \\ &= \frac{r}{\sqrt{1 + \tau^2 \omega^2}} \left\{ \cos \omega t \cdot (u_1 + u_2) - e^{-\frac{t}{\tau}} \cdot u_2 \right\}\end{aligned} \quad (16)$$

An envelope waveform of the output waveform f3 is expressed in formula (17).

[Formula 17]

$$\begin{aligned}y &= f_3(t)|_{\cos \omega t = 1} \\ &= \frac{r}{\sqrt{1 + \tau^2 \omega^2}} \left\{ u_1 + (1 - e^{-\frac{t}{\tau}}) \cdot u_2 \right\} \\ &= \frac{r}{\sqrt{1 + \tau^2 \omega^2}} \left( u - e^{-\frac{t}{\tau}} \cdot u_2 \right)\end{aligned} \quad (17)$$

Formula (17) is converted in a difference form using a calculation period Δt of the controller, and expressed as an output variation amount (Δy/Δt) shown in formula (18).

[Formula 18]

$$\frac{\Delta y}{\Delta t} = \frac{1}{\tau} \left( \frac{r}{\sqrt{1 + \tau^2 \omega^2}} \cdot u - y \right) \quad (18)$$

In the seventh embodiment, the output variation amount is sequentially calculated for every calculation period, and is used as the lower limit value.

FIG. 25 is a diagram showing effects of the lower limiter of the primary limiter 581. In FIG. 25(*a*), the solid line Lb indicates the primary single-frequency pulsation envelope temperature in a case where the lower limiter is not applied. The solid line Lr indicates the primary single-frequency pulsation envelope temperature in a case where the lower limiter is applied. As can be seen from FIG. 25(*a*), the primary single-frequency pulsation envelope temperature in the case where the lower limiter is applied are calculated as a waveform accurately enveloping the instantaneous temperature of the respective phases indicated by the broken lines. In other words, it can be seen that envelope approximation errors can be effectively reduced. Here, FIG. 25(*b*) is a block configuration diagram schematically showing an explanation on the aforementioned lower limiter.

Thus, according to the seventh embodiment, since the limiter function of the primary limiter 581 allows higher accuracy in calculation of the single-frequency pulsation temperature envelope temperature, accuracy in estimation of the temperature variation can be improved. Hence, it is possible to appropriately protect the semiconductor device from heat.

Note that the primary limiter 581 in the above description has a configuration including both functions of the upper limiter and the lower limiter. However, the primary limiter 581 may be configured to include a function of a upper limiter alone, or may be configured to include a function of a lower limiter alone. Such a configuration still has an advantage of a upper limiter or a lower limiter, and thus envelope approximation errors can be effectively reduced.

Modified Example of Seventh Embodiment

The primary limiter 581 is applicable to pulsation envelope temperature extraction filters 207 including various single-frequency pulsation extraction filters 561 to 56*n* described in the above embodiments. Note that as in the case of the second embodiment, a pulsation envelope temperature extraction filter 207 in the following modified example includes components for respective orders. The primary components are mainly described below, and secondary to n-th components have similar configurations.

Figure 26:
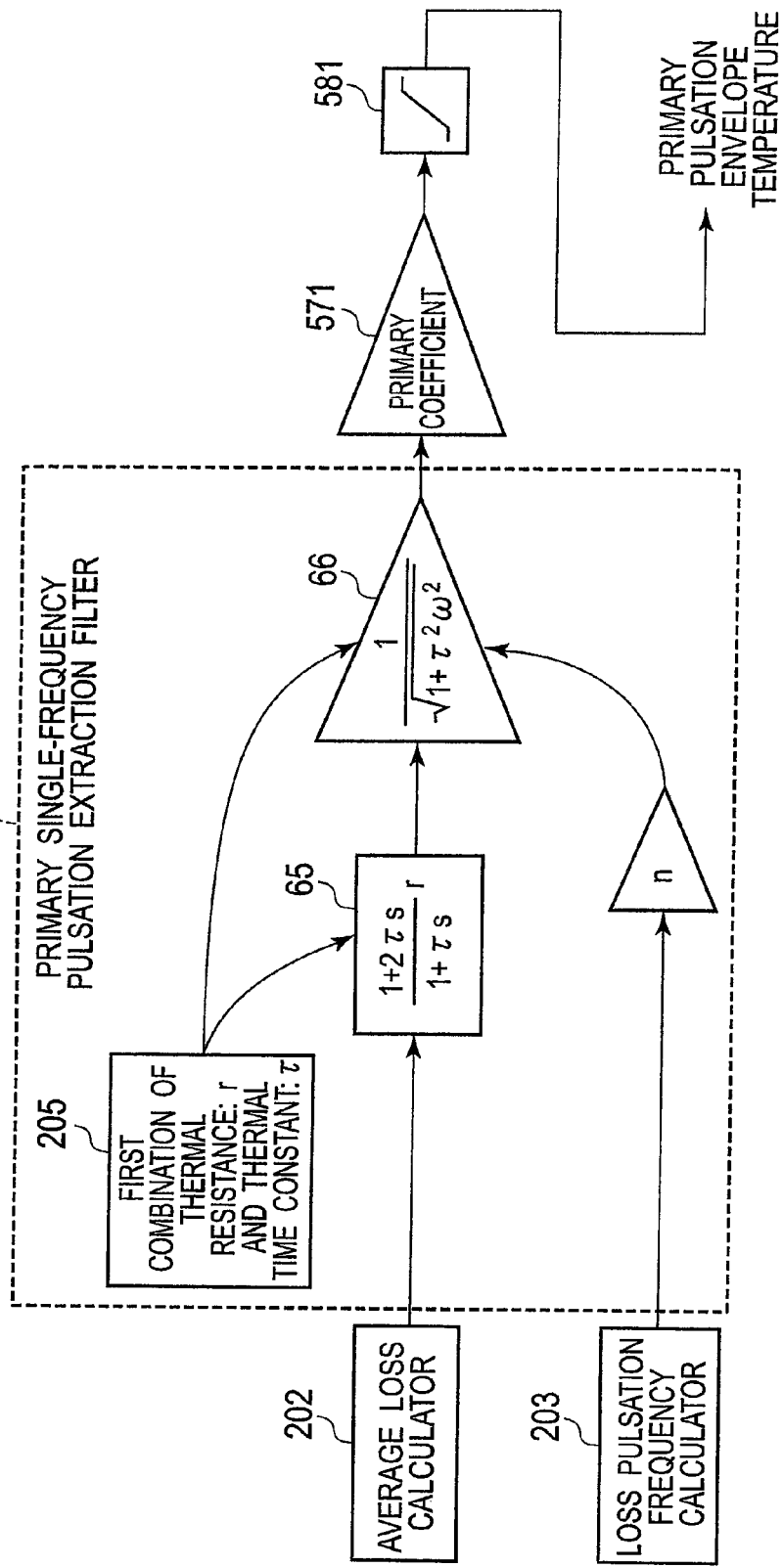
FIG. 26 is a block diagram showing a principle configuration of a pulsation envelope temperature extraction filter 207 as a modified example of a fifth embodiment.

FIG. 26 is a block diagram showing a principle configuration of the pulsation envelope temperature extraction filter 207 as a modified example of the seventh embodiment. The pulsation envelope temperature extraction filter 207 includes, as primary components, a primary limiter 581 in addition to a primary single-frequency pulsation extraction filter 63 and a primary Fourier coefficient 571. Here, as described in the third embodiment, the primary single-frequency pulsation extraction filter 63 of this embodiment includes a phase advance compensator 65 dependent on a thermal time constant τ, and a frequency dependent gain (gain) 66 dependent on a thermal resistance r, the thermal time constant τ, and a frequency of each filter 63.

The primary limiter 581 includes any one of or both of functions of the upper limiter shown in FIG. 14 and the lower limiter shown in FIG. 15. With this, envelope approximation errors can be reduced effectively in calculation of the single-frequency pulsation envelope temperature.

Figure 27:
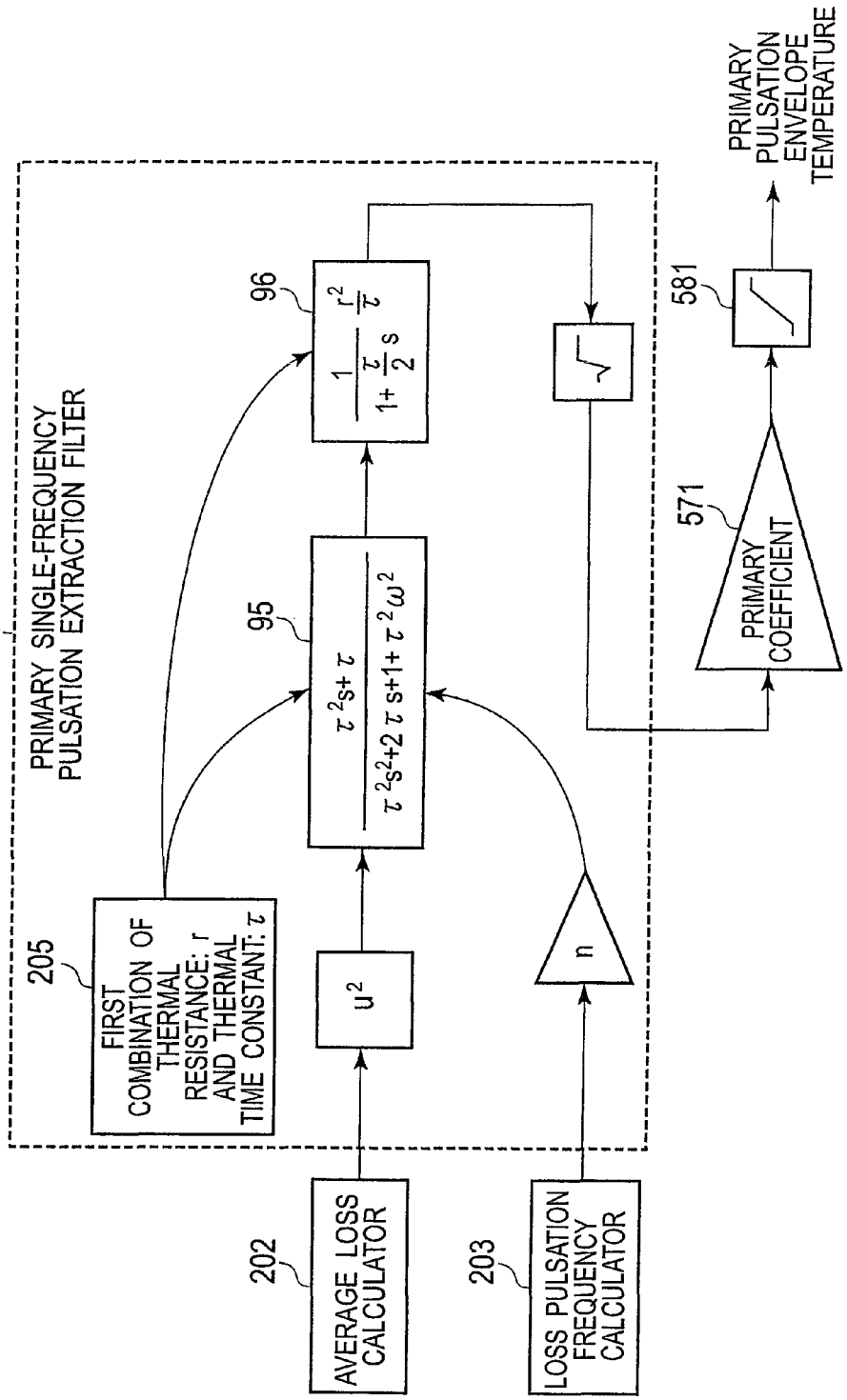
FIG. 27 is a block diagram showing a principle configuration of a pulsation envelope temperature extraction filter 207 as another modified example of a fifth embodiment.

FIG. 27 is a block diagram showing a principle configuration of a pulsation envelope temperature extraction filter 207 as another modified example of the seventh embodiment. The pulsation envelope temperature extraction filter 207 includes, as primary components, a primary limiter 581 in addition to a primary single-frequency pulsation extraction filter 93 and a primary Fourier coefficient 571. Here, as described in the sixth embodiment, the primary single-frequency pulsation extraction filter 93 of the embodiment includes: a frequency dependent gain (gain) dependent on a thermal resistance, a thermal time constant, and a pulsation frequency; a low-pass filter 96 having a cutoff frequency dependent on a thermal time constant; and a secondary filter having a natural frequency dependent on a thermal time constant and a pulsation frequency. Note that since both the frequency dependent gain and the secondary filter are dependent of the pulsation frequency, the two are shown as a single configuration (95).

The primary limiter 581 includes any one of or both of functions of the upper limiter shown in FIG. 14 and the lower limiter shown in FIG. 15. With this, envelope approximation errors can be reduced effectively in calculation of the single-frequency pulsation envelope temperature.

Figure 28:
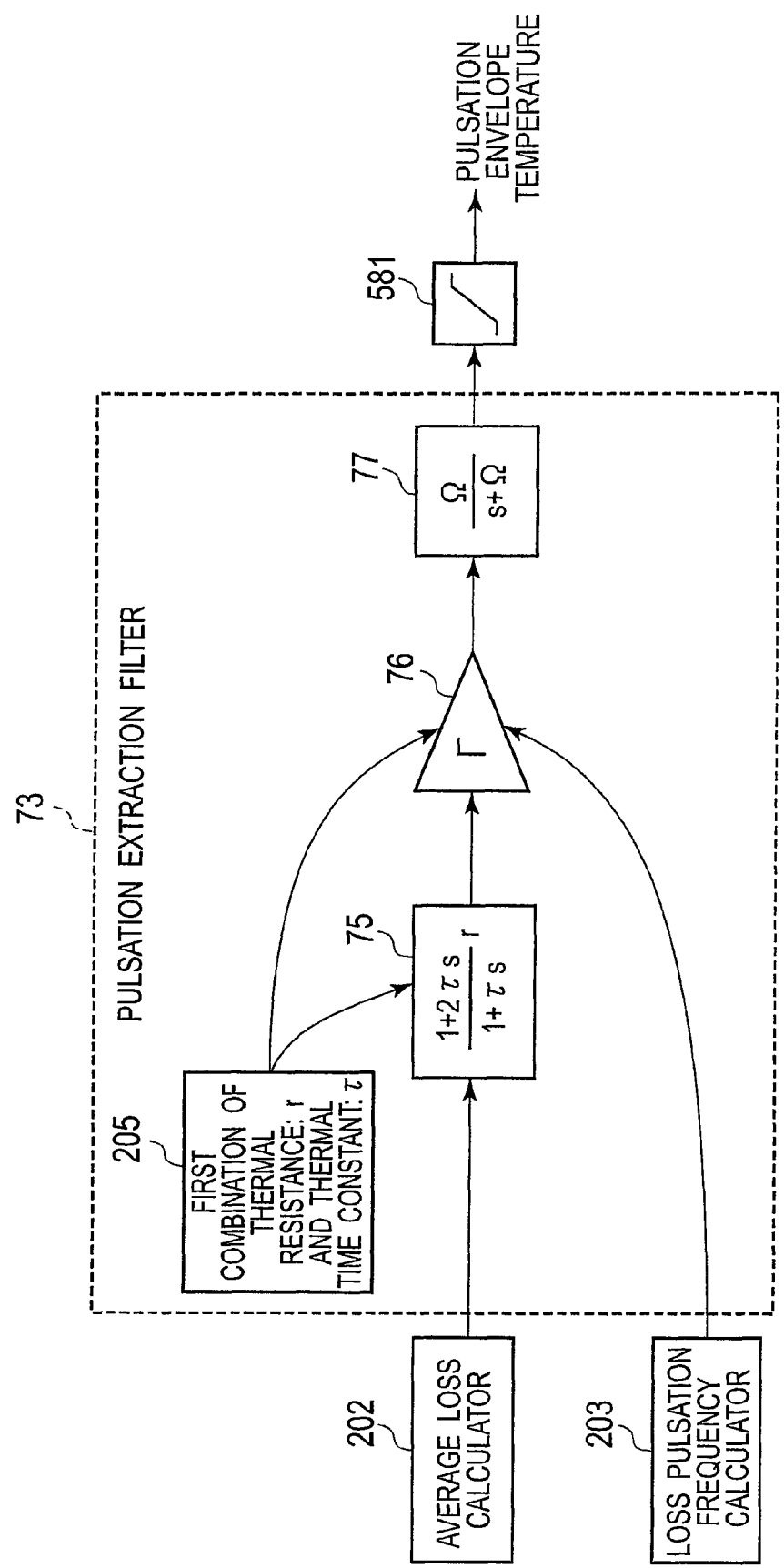
FIG. 28 is a block diagram showing a principle configuration of a pulsation envelope temperature extraction filter 207 as yet another modified example of a fifth embodiment.

FIG. 28 is a block diagram showing a principle configuration of a pulsation envelope temperature extraction filter 207 as yet another modified example of the seventh embodiment. The pulsation envelope temperature extraction filter 207 includes a limiter 581 in addition to a single-frequency pulsation extraction filter 73. Here, as shown in the primary single-frequency pulsation extraction filter 73 of the fifth embodiment, the single-frequency pulsation extraction filter 73 of this embodiment includes a phase advance compensator 75, a frequency dependent gain 76, and a low-pass filter 77.

The limiter 581 includes any one of or both of functions of the upper limiter and the lower limiter.

Figure 29:
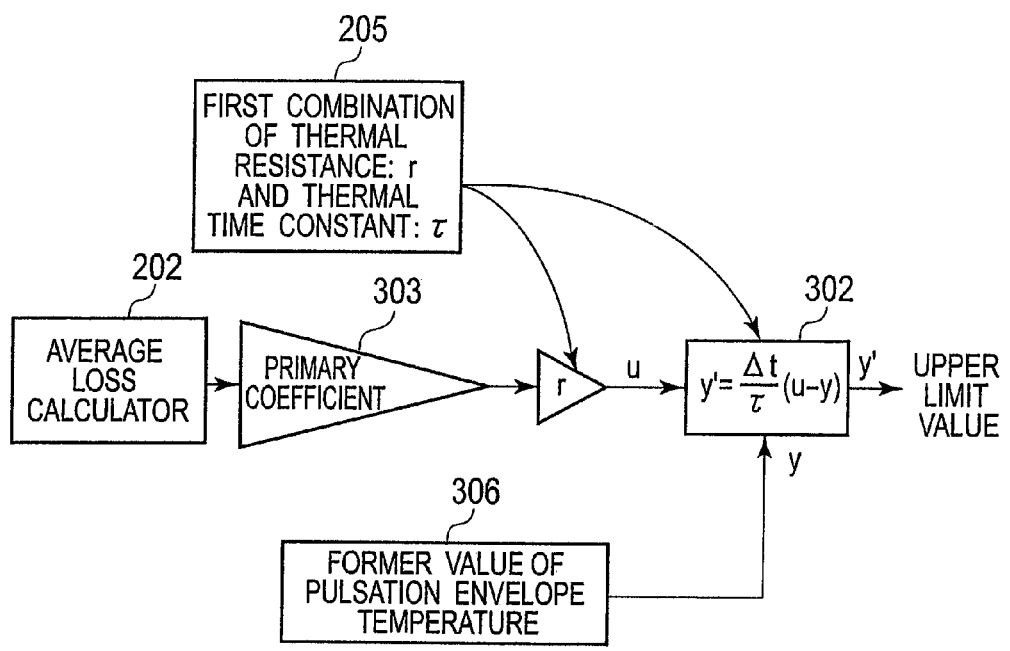
FIG. 29 is a block diagram showing a configuration of an upper limiter for calculating an upper limit value, which is a function of a primary limiter 581 in FIG. 28.

FIG. 29 is a block diagram showing a configuration of the upper limiter for calculating an upper limit value, which is a function of the limiter 581. The limiter 581 as the upper limiter includes an upper limit value calculator 302. The limiter 581 calculates an upper limit value by use of the average loss in the semiconductor device calculated by an average loss calculator 202, a primary Fourier coefficient 303, and a former value 306 of the pulsation envelope temperature. Here, the former value 306 of the pulsation envelope temperature corresponds to a value of the pulsation envelope temperature in the last calculation period, i.e., the pulsation envelope temperature obtained in a calculation carried out in a period before the calculation currently carried out.

Figure 30:
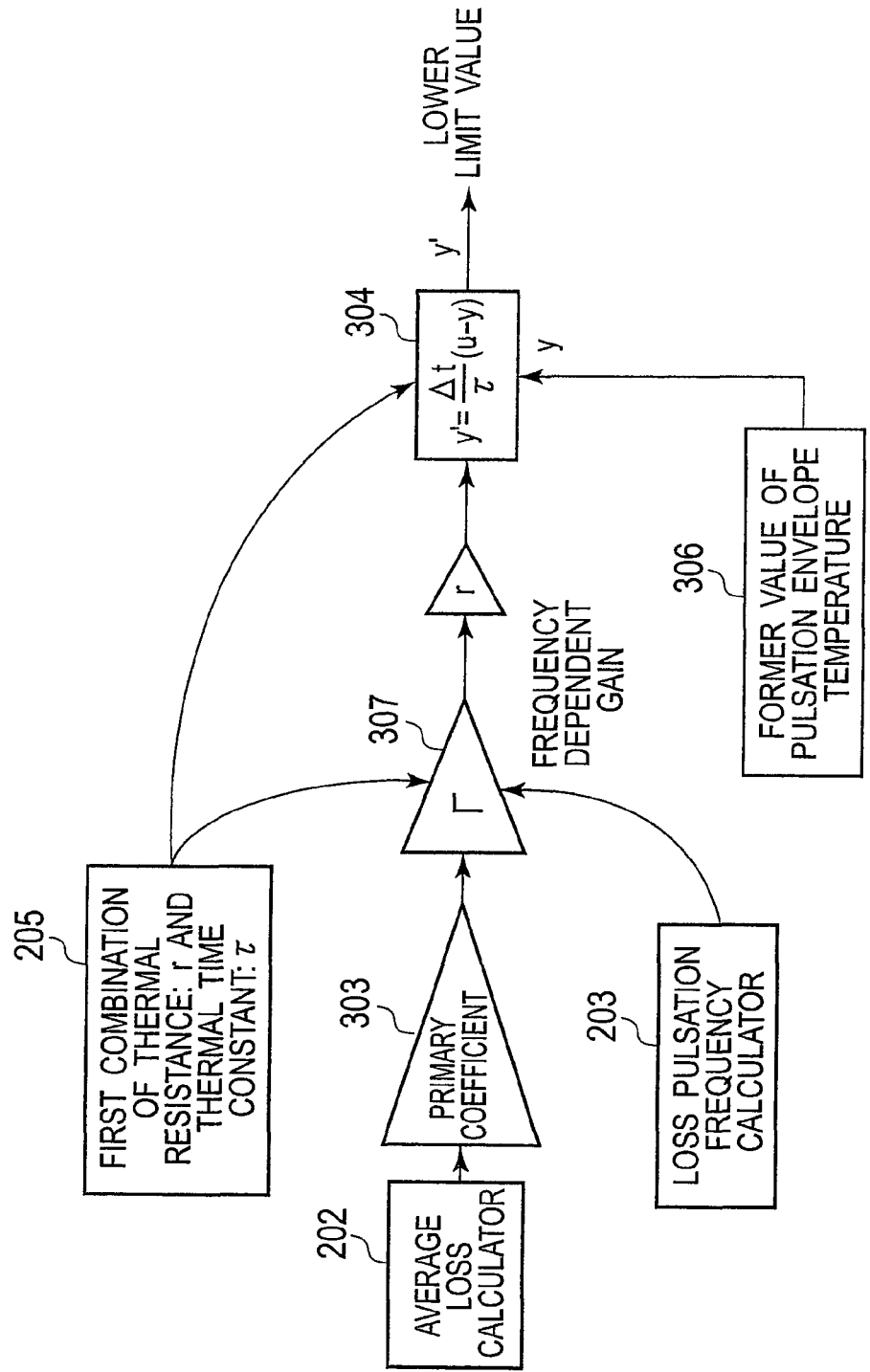
FIG. 30 is a block diagram showing a configuration of a lower limiter for calculating a lower limit value, which is a function of the primary limiter 581 in FIG. 28.

FIG. 30 is a block diagram showing a configuration of the lower limiter for calculating a lower limit value, which is a function of the limiter 581. The primary limiter 581 as the lower limiter includes a lower limit value calculator 304. The primary limiter 581 calculates a lower limit value by use of the average loss in the semiconductor device calculated by the average loss calculator 202, the primary Fourier coefficient 303, a frequency dependent gain 307, and the former value 306 of the pulsation envelope temperature. Here, the frequency dependent gain 307 corresponds to the frequency dependent gain 76 shown in FIG. 28.

The primary limiter 581 enables effective reduction of envelope approximation errors in calculation of the single-frequency pulsation envelope temperature.

Other Embodiments

As above, the present invention has been described with seven embodiments and modified examples thereof. However, the descriptions and figures included in the disclosure should not be understood as a limitation to the invention. Various alternative embodiments, examples and operational techniques will be apparent to those skilled in the art from this disclosure For example, in the inverter having the semiconductor module 104 including multiple semiconductor devices in FIG. 1, there is a case where the thermal network and average loss in FIG. 3(b) may be regarded as being common to all the semiconductor devices. In this case, a temperature estimated for an arbitrarily selected semiconductor device may be set as the semiconductor device having the highest temperature among the multiple semiconductor devices. Since there is no need to estimate the temperatures for all the semiconductor devices, the load in estimation calculation can be reduced.

In the inverter including multiple semiconductor devices in FIG. 1, a temperature estimated for a semiconductor device arbitrarily selected from among semiconductor devices having a common thermal network and average loss may be set as a temperature of the semiconductor devices having a common thermal network and average loss. Then, estimation calculations may be carried out for the number of semiconductor devices different in at least one of a thermal network and an average loss, to thereby obtain the temperature of the semiconductor device having the highest temperature among the multiple semiconductor devices included in the inverter. Thus, the load in estimation calculation can be reduced.

This application claims priority to Japanese Patent Application No. 2010-127386 filed on Jun. 3, 2010, and Japanese Patent Application No. 2010-203095 filed on Sep. 10, 2010 the entire contents of which are incorporated by reference herein.

INDUSTRIAL APPLICABILITY

According to the controller of the power converter, the partial temperature variation estimation part estimates an average temperature from loss in the semiconductor device, a thermal resistance, and a thermal time constant; extracts a pulsation envelope temperature exceeding the maximum value of pulsation temperature dependent on the average loss and pulsation frequency by use of the thermal resistance, thermal time constant and pulsation frequency of loss; and adds the average temperature and pulsation envelope temperature to estimate the temperature variation in the semiconductor device. Thus, the semiconductor device can be effectively protected from heat by estimating a temperature exceeding the maximum value of the pulsating temperature, not only in the average-temperature saturated state but also in the average-temperature transit state. Accordingly, the controller of the power converter according to the present invention is industrially applicable.

REFERENCE SIGNS LIST

65, 75 phase advance compensator

66, 76 frequency dependent gain (gain)

77, 87 low-pass filter

95 frequency dependent gain (gain) and secondary filter

202 average loss calculator

204 partial temperature variation estimation part

2041 to 204m first to m-th combination partial temperature variation estimation part

206 average temperature estimation part

207 pulsation envelope temperature extraction filter

561 to 56n first to n-th single-frequency pulsation extraction filter

The invention claimed is:

1. A controller of a power converter comprising:
an average loss calculator configured to calculate an average loss in a semiconductor device in a period of carrying out an estimation calculation of a temperature of the semiconductor device; and
a partial temperature variation estimation part configured to, while regarding the semiconductor device as a thermal network including at least one combination of a thermal resistance and a thermal time constant, estimate a partial temperature variation of the combination from a loss in the semiconductor device and the combination of the thermal resistance and the thermal time constant, wherein
the partial temperature variation estimation part comprises:
an average temperature estimation part configured to estimate an average temperature from the loss, the thermal resistance, and the thermal time constant; and
a pulsation envelope temperature extraction filter configured to extract, by use of the thermal resistance, the thermal time constant, and a pulsation frequency of the loss, a pulsation envelope temperature exceeding the maximum value of a pulsation temperature dependent on the average loss and the pulsation frequency, and
the partial temperature variation estimation part estimates a temperature variation in the semiconductor device by adding the average temperature and the pulsation envelope temperature.

2. The controller of a power converter according to claim 1, wherein the partial temperature variation estimation part estimates, while regarding the semiconductor device as a thermal network including two or more combinations of a thermal resistance and a thermal time constant, the partial temperature variation for each combination from the loss and the combination of the thermal resistance and the thermal time constant, and
the controller further comprises a device temperature variation estimation part configured to estimate a temperature variation in the semiconductor device by combining the partial temperature variations estimated for the respective combinations.

3. The controller of a power converter according to claim 1, wherein
the pulsation envelope temperature extraction filter extracts the pulsation envelope temperature by extracting a partial filter for each frequency component by performing a Fourier series expansion for a loss waveform of the semiconductor device, and combining results of calculations using the extracted filters,
the partial filter for each of the frequency components is configured on the basis of a thermal resistance, a thermal time constant, and a frequency corresponding to the frequency component, and
the pulsation envelope temperature extraction filter combines filter outputs of the respective frequency components according to a Fourier coefficient in the Fourier series expansion.

4. The controller of a power converter according to claim 3, wherein
the partial filters each comprises:
a phase advance compensator dependent on a thermal time constant; and
a gain dependent on a thermal resistance, a thermal time constant, and a frequency of each of the partial filters, the gain is set smaller with a smaller thermal resistance, set smaller with a larger thermal time constant, and set smaller with a higher frequency of each of the partial filters.

5. The controller of a power converter according to claim 4, wherein the partial filters each further comprises a low-pass filter having the cutoff frequency dependent on a thermal time constant and a frequency of each of the partial filters, and
the cutoff frequency is set lower with a larger thermal time constant, and set lower with a lower frequency of each of the partial filters.

6. The controller of a power converter according to claim 5, wherein
a total of gains of the partial filters is used as a gain included in each of the partial filters, and
the low-pass filter included in each of the partial filters uses the cutoff frequency being an average weighted by the gains of the respective partial filters.

7. The controller of a power converter according to claim 3, wherein the pulsation envelope temperature extraction filter extracts the pulsation envelope temperature by combining results of calculations using partial filters of only a primary frequency component among partial filters of respective frequency components extracted by performing the Fourier series expansion on the loss waveform of the semiconductor device.

8. The controller of a power converter according to claim 3, wherein
the partial filters each comprises:
a gain dependent on a thermal resistance, a thermal time constant, and a pulsation frequency;
a low-pass filter having a cutoff frequency dependent on a thermal time constant; and
a secondary filter having a natural frequency dependent on a thermal time constant and a pulsation frequency,
the gain is set smaller with a smaller thermal resistance, set smaller with a larger thermal time constant, and set smaller with a higher pulsation frequency,
the cutoff frequency is set lower with a larger thermal time constant, and
the natural frequency is set lower with a larger thermal time constant, and set lower with a lower pulsation frequency.

9. The controller of a power converter according to claim 1, wherein in an inverter including a plurality of semiconductor devices, when a thermal network and an average loss is able to be regarded as being common to all of the semiconductor devices, a temperature estimated for an arbitrarily selected semiconductor device is set as a temperature of a semiconductor device having the highest temperature among the plurality of semiconductor devices.

10. The controller of a power converter according to claim 1, wherein
in an inverter including a plurality of semiconductor devices, a temperature estimated for a semiconductor device arbitrarily selected from among semiconductor devices having a common thermal network and average loss is set as a temperature of the semiconductor devices having the common thermal network and average loss, and
the controller carries out estimation calculations for the number of semiconductor devices different in at least one of a thermal network and an average loss to thereby obtain the temperature of the semiconductor device having the highest temperature among the plurality of semiconductor devices included in the inverter.

11. The controller of a power converter according to claim 1, wherein the partial temperature variation estimation part further comprises a limiter configured to output a pulsation envelope temperature extracted by the pulsation envelope temperature extraction filter while setting a predetermined limit value.

12. The controller of a power converter according to claim 11, wherein
the limiter comprises a upper limiter configured to output the pulsation envelope temperature in a limited manner by setting an upper limit value,
the upper limit value is obtained as an output variation amount of the pulsation envelope temperature when the pulsation frequency is zero, by using the average loss and a value of the pulsation envelope temperature in the last calculation period, and
the value of the pulsation envelope temperature in the last calculation period is sequentially updated by a value outputted from the upper limiter.

13. The controller of a power converter according to claim 11, wherein
the limiter comprises a lower limiter configured to output the pulsation envelope temperature in a limited manner by setting a lower limit value,
the lower limit value is obtained as an output variation amount of the pulsation envelope temperature corresponding to a phase in which temperature is maximized when the average loss decreases, by using the average loss and the value of the pulsation envelope temperature in the last calculation period, and
the value of the pulsation envelope temperature in the last calculation period is sequentially updated by a value outputted from the lower limiter.

14. The controller of a power converter according to claim 13, wherein
the limiter further comprises a upper limiter configured to output the pulsation envelope temperature in a limited manner by setting an upper limit value,
the upper limit value is obtained as an output variation amount of the pulsation envelope temperature when the pulsation frequency is zero, by using the average loss and the value of the pulsation envelope temperature in the last calculation period, and
the value of the pulsation envelope temperature in the last calculation period is sequentially updated by a value outputted from the upper limiter.

15. A controller of a power converter comprising:
average loss calculation means for calculating an average loss in a semiconductor device in a period of carrying out an estimation calculation of a temperature of the semiconductor device; and
partial temperature variation estimation means for, while regarding the semiconductor device as a thermal network including at least one combination of a thermal resistance and a thermal time constant, estimating a partial temperature variation of the combination from a loss in the semiconductor device and the combination of the thermal resistance and the thermal time constant, wherein
the partial temperature variation estimation means comprises:
average temperature estimation means for estimating an average temperature from the loss, the thermal resistance, and the thermal time constant; and
pulsation envelope temperature extraction filter means for extracting, by use of the thermal resistance, the thermal time constant, and a pulsation frequency of the loss, a pulsation envelope temperature exceeding the maximum value of a pulsation temperature dependent on the average loss and the pulsation frequency, and the partial temperature variation estimation means estimates a temperature variation in the semiconductor device by adding the average temperature and the pulsation envelope temperature.

\* \* \* \* \*